US008313800B2

(12) United States Patent
Shiraishi et al.

(10) Patent No.: US 8,313,800 B2
(45) Date of Patent: *Nov. 20, 2012

(54) METHOD FOR PRODUCING CONDUCTIVE COATING FILM

(75) Inventors: Kinya Shiraishi, Tokyo (JP); Kaori Sakaguchi, Tokyo (JP)

(73) Assignee: Toyo Ink Mfg. Co., Ltd., Tokyo (JP)

( * ) Notice: Subject to any disclaimer, the term of this patent is extended or adjusted under 35 U.S.C. 154(b) by 565 days.

This patent is subject to a terminal disclaimer.

(21) Appl. No.: 12/298,847

(22) PCT Filed: Apr. 26, 2007

(86) PCT No.: PCT/JP2007/059085
§ 371 (c)(1),
(2), (4) Date: Oct. 28, 2008

(87) PCT Pub. No.: WO2007/126012
PCT Pub. Date: Nov. 8, 2007

(65) Prior Publication Data
US 2009/0258241 A1 Oct. 15, 2009

(30) Foreign Application Priority Data

Apr. 28, 2006 (JP) ................. 2006-125748
Aug. 23, 2006 (JP) ................. 2006-225942

(51) Int. Cl.
B05D 5/12 (2006.01)
B05D 7/00 (2006.01)
(52) U.S. Cl. .................. 427/212; 427/58; 427/123
(58) Field of Classification Search ............... 427/58, 427/123, 212
See application file for complete search history.

(56) References Cited

U.S. PATENT DOCUMENTS
2004/0197549 A1  10/2004  Inokuma et al.

FOREIGN PATENT DOCUMENTS

| EP | 1 666 408 A1 | | 6/2006 |
|---|---|---|---|
| JP | 61-276907 | | 12/1986 |
| JP | 11-80647 | | 3/1999 |
| JP | 2000-260224 | | 9/2000 |
| JP | 2003-16836 | | 1/2003 |
| JP | 2003-308731 | | 10/2003 |
| JP | 2003-308732 | | 10/2003 |
| JP | 2003-327920 | | 11/2003 |
| JP | 2004-241294 | | 8/2004 |
| JP | 2004-273205 | | 9/2004 |
| JP | 2005-81501 | | 3/2005 |
| JP | 2005-081501 | * | 3/2005 |
| JP | 2005-100721 | | 4/2005 |
| WO | WO 2007/043664 A1 | | 4/2007 |

OTHER PUBLICATIONS

Machine translation of JP 2005-081501A (2005).*

* cited by examiner

*Primary Examiner* — Brian K Talbot
(74) *Attorney, Agent, or Firm* — McDermott Will & Emery LLP

(57) ABSTRACT

A conductive coating film is formed on a substrate by bringing a conductive material covered with a protective material into contact with a material having anion exchange ability, through such a process wherein an anion exchange layer containing a material having anion exchange ability is formed on a substrate and then a layer containing a conductive material covered with a protective material is formed on the anion exchange layer, or alternatively through such a process wherein a layer containing a conductive material covered with a protective material is formed on a substrate and then an anion exchange layer containing a material having anion exchange ability is formed on the layer containing a conductive material. The anion exchange layer and the layer containing a conductive material may be formed by coating, printing or the like. By using this method, a conductive coating film having excellent adhesion to a substrate can be formed on an ordinary paper substrate, plastic substrate and glass substrate at low temperature in short time.

7 Claims, No Drawings

METHOD FOR PRODUCING CONDUCTIVE COATING FILM

RELATED APPLICATIONS

This application is the U.S. National Phase under 35 U.S.C. §371 of International Application No. PCT/JP2007/059085, filed on Apr. 26, 2007, which in turn claims the benefit of Japanese Application No. 2006-425748 and Japanese Application No. 2006-225942, filed on Apr. 28, 2006 and Aug. 23, 2006 respectively, the disclosures of which Applications are incorporated by reference herein.

TECHNICAL FIELD

The present invention relates to a method for producing a conductive coating film that contains a conductive material, a conductive coating film that is produced by the production method, and a laminate that has the conductive coating film.

BACKGROUND ART

A conductive coating film has a broad range of use such as shielding an electromagnetic wave generated from a cathode-lay tube, a plasma display panel and the like, an infrared ray shielding film of a constructive material or an automobile, an anti-static coating film of an electronic equipment or a cellular phone, an anti-fogging hot coil on glass, wiring for a circuit board, coating for imparting conductivity to a resin, and a circuit itself and the like. As methods for forming such conductive coating films, there are conventionally known methods such as a vacuum metal deposition method, a chemical deposition method, an ion sputtering method and a method in which metal particles are dispersed in a dispersing medium and the resulting metal colloidal solution is applied, heated and sintered. However, these methods have problems such that the complicate operation is needed, mass producibility is inferier, and heating at high temperature is required, etc.

Meanwhile, there is known another method forming wiring on a printing board and the like by etching a conductive film. However, the etching process is not only a cumbersome and costly process but also has problems of a treatment of waste liquid etc. Thus, it is not preferable in an environmental point of view. In addition, there is an additional problem that a usable substrate is limited to one having resistance to etching, such as a plastic film and the like. Furthermore, when conductive paste is used, it is needed that a conductive circuit such as wiring should be formed by a screen printing method. In this case, heating at high temperature is required after the printing in order to obtain good conductivity and the lowest limit of volume resistance thereof is of the order of $10^{-5}$ $\Omega\cdot cm$ (see Patent Document 1 and 2 below).

On the other hand, it has been recently known that volume resistance of the order of $10^{-6}$ $\Omega\cdot cm$ can be obtained on a relatively thin film having thickness of 0.1 to 5 μm by use of silver nanoparticles (see Non-Patent Document 1 and 2 below). However, paste containing the silver nanoparticles needs heating and sintering at high temperature of 200° C. or so for several tens of minutes in order to obtain such resistance. As such, this method cannot be applied to an ordinary paper substrate such as a coating paper and a plastic film substrate such as polyester. In addition, this method is disadvantageous in that the adhesiveness between a formed conductive circuit or conductive coating film and a substrate is poor and a crack may be easily formed (see Patent Document 3 and 4 below).

Patent Document 1: JP-A 2000-260224
Patent Document 2: JP-A 2003-16836
Patent Document 3: JP-A 2004-273205
Patent Document 4: JP-A 2005-81501
Non-Patent Document 1: Journal of Japan Institute of Electronics Packaging Society, Vol. 5, No. 6 (2002), pp.
Non-Patent Document 2: Nikkei Nano Business, Vol. 22 (2005, Sep. 26), pp. 2-7

DISCLOSURE OF THE INVENTION

Problems to be Solved by the Invention

Consequently, an object of the present invention is to provide a method for producing a conductive coating film that is free of the problems described above in prior art, a conductive coating film produced by the production method, and a laminate which includes the conductive coating film.

More specifically, an object of the present invention is to provide a method for producing a conductive coating film by which a conductive coating film can be formed on any substrate including an ordinary paper, plastic, cloth or glass and the like at low temperature in short time, and in addition to the above addressed characteristic, the conductive coating film has low volume resistance, for example of the order of $10^{-6}$ $\Omega\cdot cm$, and excellent adhesion to a substrate; a conductive coating film produced by the production method; and a laminate which includes the conductive coating film.

Means for Solving the Problems

The present invention relates to a method for producing a conductive coating film, a conductive coating film, and a laminate, as described hereinafter.

(1) A method for producing a conductive coating film, wherein a conductive material covered with a protective material is brought into contact with a material having anion exchange ability.

(2) The method for producing a conductive film as described in the above Item 1, wherein the protective material contains a dispersing agent.

(3) The method for producing a conductive film as described in the above Item 2, wherein the dispersing agent contains a fatty acid.

(4) The method for producing a conductive coating film as described in the above Item 3, wherein the fatty acid include a saturated or unsaturated fatty acid having carbon atoms of 3 to 22.

(5) The method for producing a conductive coating film as described in the above Item 1, wherein the conductive material is conductive fine particles having an average particle diameter of 0.001 to 10 μm.

(6) The method for producing a conductive coating film as described in the above Item 5, wherein the conductive material is at least one of materials selected from metals consisting of gold, silver, copper, nickel, platinum, palladium and iron, and alloys of these metals.

(7) The method for producing a conductive coating film as described in the above Item 5, wherein the conductive material is silver.

(8) The method for producing a conductive coating film as described in any one of the above Items 1 to 7, wherein an anion exchange layer containing a material having anion exchange ability is formed on a substrate and then a coating film layer containing a conductive material covered with a protective material is formed on the anion exchange layer.

(9) The method for producing a conductive coating film as described in any one of the above Items 1 to 7, wherein a coating film layer containing a conductive material covered with a protective material is formed on a substrate and then an anion exchange layer containing a material having anion exchange ability is formed on the coating film layer.

(10) A conductive coating film that is produced by a method described in any one of the above Items 1 to 9.

(11) A laminate that is laminated on a substrate an anion exchange layer containing a material having anion exchange ability and a coating film layer containing a conductive material covered with a protective material in this order.

(12) A laminate that is laminated on a substrate a coating film layer containing a conductive material covered with a protective material and an anion exchange layer containing a material having anion exchange ability in this order.

(13) The laminate as described in any one of the above Item 11 or 12, wherein the protective material includes a saturated or unsaturated fatty acid having carbon atoms of 3 to 22.

Advantageous Effect of the Invention

A conductive coating film having excellent conductivity, for example, volume resistance of the order of $10^{-6}$ $\Omega \cdot cm$, can be produced at low temperature in short time according to the method for producing a conductive coating film of the present invention. Further, because the conductive coating film of the present invention has excellent adhesion to a paper, various plastic films, cloths and glass and the like, it can be easily formed on all kinds of a substrate, regardless of a specific type of the substrate.

Furthermore, the composition for forming a coating film used for forming the conductive coating film of the present invention is a composition, for example, a printing ink or a coating material having characteristics suitable for various printing method such as gravure printing, flexography, and ink-jet printing, and various coating methods. Therefore, a conductive circuit or a conductive film can be formed on a substrate with high mass productivity and low cost by an appropriate printing method or a coating method.

Having an excellent conductive property even in a thin film, the conductive coating film of the present invention may be used for an antenna circuit for a non-contact type IC media, a conductive circuit on a printing board, a conductive material for printing electronics, various types of electrode materials, a mesh forming materials for shielding an electromagnetic wave, a conductive thin film for shielding an electromagnetic wave, an anti-static film, and a film providing conductivity to a non-conductive material, for example a conductive film for an electrically conductive cloth and the like.

BEST MODE FOR CARRYING OUT THE INVENTION

Hereinafter, the present invention will be described more in detail. However, it is obvious that, as long as it does not deviate from the technical spirit of the present invention, the present invention is not limited to the following explanations and embodiments.

First, the method for producing a conductive coating film of the present invention is characterized in that a conductive material covered with a protective material is brought into contact with a material having anion exchange ability. As aspects for bringing a conductive material covered with a protective material into contact with a material having anion exchange ability includes, there are exemplified (I) a layer containing a conductive material covered with a protective material and a layer containing a material having anion exchange ability (i.e., an anion exchange layer) are formed as a neighboring layer, and (II) a conductive material covered with a protective material and a material having anion exchange ability are contained at the state brought into contact with each other in the same layer.

As methods for producing a conductive coating film according to the method (I) above, there are exemplified a method (I-1) wherein an anion exchange layer containing a material having anion exchange ability is formed on a substrate and then a coating film layer containing a conductive material covered with a protective material is formed on the anion exchange layer to form a conductive coating film, and a method (I-2) wherein a coating film layer containing a conductive material covered with a protective material is formed on a substrate and then an anion exchange layer containing a material having anion exchange ability is formed on the coating film layer to form a conductive coating film.

Further, as a method for producing a conductive coating film according to method (II) above, there is exemplified a method for forming a layer consisting of a composition which contains a conductive material covered with a protective material and a material having anion exchange ability on a substrate.

These layers are formed by applying on the substrate a composition such as a composition for forming a coating film containing a conductive material covered with a protective material, a composition for forming a coating containing a material having anion exchange ability, or a composition for forming a coating film containing a conductive material covered with a protective material by coating, printing or the like to give a conductive coating film layer. However, it is only required in the method for producing a conductive coating film of the present invention that a conductive material covered with a protective material and a material having anion exchange ability are in contact with each other according to any means. As such, a method of bringing a conductive material covered with a protective material into contact with a material having anion exchange ability is not limited to the methods exemplified above.

Hereinafter, (A) a conductive material covered with a protective material, (B) a material having anion exchange ability, and (C) compositions for forming a coating film containing these materials alone or in combination thereof, which are used in the present invention, as well as (D) a method for forming a conductive coating film, which is adopted in the present invention, (E) a laminate having a conductive coating film of the present invention, and (F) various use of the conductive coating film, will be more specifically explained in the order.

(A) Conductive Material Covered with Protective Material

First, a conductive material of a conductive material covered with a protective material used in the present invention is explained. The conductive material in the present invention is used for providing conductivity to a coating film, and any kind of conductive materials may be used as long as it can provide conductivity to a coating film. Representative examples of such conductive material include a conductive metallic material. Examples of the conductive metallic material include conductive metallic substances such as gold, silver, copper, nickel, platinum, palladium, iron, cobalt, tungsten, titanium, indium, iridium, rhodium, and amorphous copper; alloys of these metals such as silver-copper alloy; metal composites of these metals such as silver-copper composite; metals coated with other conductive metal such as silver-plated copper; and the like. Among the conductive metals, gold, silver, copper, nickel, platinum, palladium, and iron are preferred, and gold, silver, copper, and nickel are more preferred. In terms of conductivity and cost, silver is still more preferred. Other conductive materials that may be used in the present invention include inorganic powders coated with the above metallic materials, metal oxides such as silver oxide, indium oxide, antimony oxide, zinc oxide, tin oxide, antimony-doped tin oxide, indium-tin composite oxide and the like, carbon black, graphite, a metal complex, an organic conductive material and the like. The conductive materials can be used alone or in combination of two or more thereof. When a conductive material is used in combination of two or more, such multiple materials may be in any form including a mixture, a melt mixture, a dispersion, a coated material and the like. In addition, as a conductive material, a fine particle, for example a fine particle having an average particle diameter in the range of 0.001 to 10 μm, is preferably used in the present invention. A conductive coating film having an excellent conductivity may be formed at low temperature in short time by use of conductive fine particles with the diameter range described above. If the average particle diameter is greater than the upper limit of the range, it is undesirable as there is the possibility that not only the conductivity deteriorates but also fusibility of conductive materials at low temperature is impaired.

The conductive metallic materials having an average particle diameter within the range described above include (A-1) a conductive metallic material in powder form which is prepared by a conventionally known or well known production method such as a wet method, an atomizing method, an electrolysis method or the like. With respect to the shape of the conductive metallic material (A-1), a flaky form, a scale form, a plate form, a spherical form, an almost spherical form, an agglomerated spherical form, a dendritic form, a leaf form and the like are known, and any kind of these forms may be used in the present invention. In addition, the conductive metallic materials produced by the production methods described above have typically an average particle diameter of 1 μm or more. However, from the reason described above, the material with an average particle diameter of 1 to 10 μm is preferred.

Further, as another kind of the conductive metallic material having an average particle diameter within the range described above, there is exemplified (A-2) conductive fine particles with an average particle diameter of 0.001 to 0.1 μm, which is obtained, for example, by a vapor phase method such as evaporation in gas, a liquid phase method in which a metal compound is reduced in a liquid phase by use of ultrasonic wave, ultraviolet light or a reducing agent (see Patent Document 5 and 6 below), a melting process, an electrolysis method and the like. Although it may vary depending on methods for producing a conductive coating film layer, it is more preferred to use conductive fine particles with an average particle diameter of 0.001 to 0.05 μm in the present invention. The conductive fine particle (A-2) is more preferred one compared with the above conductive metallic material (A-1). Among the conductive fine particle (A-2), conductive fine particles obtained by a liquid phase method in which a metal compound is reduced in a liquid phase by ultrasonic wave, ultraviolet light or a reducing agent is preferred, considering a production cost and the number of production steps required for production thereof.

Each of the above conductive fine particles (A-1) and (A-2) may be used alone or in combination of two or more thereof.
 Patent Document 5: JP-A 11-80647
 Patent Document 6: JP-A 61-276907

Moreover, the average particle diameter of the conductive material of the present invention is measured by a apparatus for measuring distribution of particle diameters based on dynamic light scattering method (for example, Microtrac or Nanotrack manufactured by Nikkiso Co., Ltd.).

Further, the conductive material coated with a protective material is used in the present invention as a conductive material. The protective material is used for preventing agglomeration of conductive fine particles (that is the conductive material) and for improving dispersing stability of the conductive material in a composition for forming a coating film layer which contains a conductive material such as a conductive ink and a conductive coating material when the conductive material is used as the composition. Therefore, any material may be used as a protective material as long as the material satisfies the purposes described above. Examples of the protective material that satisfies the purposes described above include compounds with one or more groups having affinity to a conductive material therein. Although it may vary depending on a type of a conductive material used, the affinity groups to a conductive material include generally polar groups such as an amino group, a quaternary ammonium group, a hydroxyl group, a cyano group, a carboxyl group, a thiol group, a sulfonic acid group, a phosphoric acid group, and a phosphoric ester group. However, the affinity group to a conductive material is not limited thereto. These affinity groups may be contained in a main chain of the compound, in a side chain of the compound, or in both. Examples of the compound which has one or more of affinity groups to a conductive material include a pigment dispersing agent, a surfactant, a coupling agent, a fatty acid and the like. The preferable protective material is one including a dispersing agent in the present invention. Further, a fatty acid is preferred as the dispersing agent. The reason is that when conductive fine particles covered with a protective material containing fatty acids is used, the conductive coating film can be formed at lower temperature in shorter time. In addition, the term "containing a dispersing agent" or "containing a fatty acid" includes both cases of using a dispersing agent or a fatty acid alone and using a dispersing agent or a fatty acid together with other protective agent at the same time in the present invention. Hereinafter, the dispersing agent used as the protective material in the present invention such as a pigment dispersing agent, a surfactant, a coupling agent, and a fatty acid will be more specifically described below.

The pigment dispersing agent, which can be used as a protective material in the present invention, may be any one having one or more of affinity group to a conductive material in a compound and is not specifically limited. Various kinds and types of a pigment dispersing agent are commercially available and any one of such commercially available pigment dispersing agents can be used as a protective material for the conductive material of the present invention. Examples of the commercially available pigment dispersing agent, which can be used as a protective material in the present invention, include Solsperse 3000, Solsperse 9000, Solsperse 17000, Solsperse 24000, Solsperse 28000, Solsperse 32000, Solsperse 35100, Solsperse 36000, Solsperse 41000 (all manufactured by Lubrizol Japan Ltd.), SMA1000, SMA2000, SMA3000, SMA1440, SMA17352, SMA2625, SMA3840 (all manufactured by Kawahara Petrochemical), EFKA4009, EFKA4046, EFKA4047, EFKA4080, EFKA4010, EFKA4015, EFKA4020, EFKA4050, EFKA4055, EFKA4060, EFKA4080, EFKA4400, EFKA4401, EFKA4402, EFKA4403, EFKA4300, EFKA4330, EFKA4340, EFKA6220, EFKA6225, EFKA6230, EFKA6525, EFKA6700, EFKA6745, EFKA6780, EFKA6782, EFKA6903, EFKA6906, EFKA6950, EFKA7462, EFKA8502, EFKA8503, EFKA8511, EFKA8512, EFKA8580, EFKA8590 (all manufactured by EFKA ADDITIVES), Ajisper PB821, Ajisper PB711, Ajisper PB822, Ajisper PN411, Ajisper PA111 (all manufactured by Ajinomoto Fine-Techno, Inc.), TEXAPHOR-UV20, TEXAPHOR-UV21, TEXAPHOR-UV61 (all manufactured by Cognis Japan Ltd.), Disperbyk-101, Disperbyk-102, Disperbyk-103, Disperbyk-106, Disperbyk-110, Disperbyk-111, Disperbyk-140, Disperbyk-142, Disperbyk-145, Disperbyk-161, Disperbyk-162, Disperbyk-163, Disperbyk-164, Disperbyk-166, Disperbyk-167, Disperbyk-168, Disperbyk-170, Disperbyk-171, Disperbyk-174, Disperbyk-180, Disperbyk-182, Disperbyk-2000, Disperbyk-2001, Disperbyk-2050, Disperbyk-2070, Disperbyk-2090 (all manufactured by BYK-Chemie Japan), Disparlon KS-860, Disparlon KS-873N, Disparlon 7004, Disparlon 1831, Disparlon 1850, Disparlon 1860, Disparlon 2150, Disparlon DA-400N, Disparlon PW36, Disparlon DA-703-50, Disparlon DA-725, Disparlon DA-705, Disparlon DA-7301, Disparlon DA-325, Disparlon DA-375, Disparlon DA-234, Disparlon DN-900, Disparlon DA-1200 (all manufactured by Kusumoto Chemicals, Ltd.) and the like. These pigment dispersing agents may be used alone or in combination of two or more thereof. Further, the pigment dispersing agent may be used in combination with a protective material of the present invention that is different from a pigment dispersing agent.

As a surfactant, an anionic type, a non-ionic type, an amphiphilic type and a cationic type are known. Any of these surfactants can be used as a protective material in the present invention. The surfactant that is used in the present invention may be any compound known as a surfactant. From an easy acquisition point of view, compounds that are commercially available as a surfactant can be preferably used but is not limited thereto. There will be described below unlimited specific examples of an anionic surfactant, a non-ionic surfactant, an amphoteric surfactant and a cationic surfactant, which can be used in the present invention.

Examples of the anionic surfactant include higher fatty acid salt, alpha sulfo fatty acid methyl ester salt, alkyl sulfonic acid salt, alkyl benzenesulfonic acid salt, alkyl sulfuric acid ester salt, alkyl ether sulfuric acid ester salt, monoalkyl phosphoric acid ester salt, alpha-olein sulfonic acid salt, alkane sulfonic acid salt, sulfosuccinic acid ester salt, alkyl ether sulfonic acid salt, alkyl ether carobxylic acid salt, methyl tauric acid salt and the like.

Examples of the non-ionic surfactant include glycerin fatty acid ester, sucrose fatty acid ester, sorbitan fatty acid ester, polyoxyethylene sorbitan fatty acid ester, polyethylene glycol alkyl ether, polyethylene glycol alkylphenyl ether, polyethylene glycol fatty acid ester, polyoxyethylene fatty acid ester, fatty acid alkanol amide, polyoxyethylene alkyl ether, alkyl glucoside, polyoxyethylene alkylphenyl ether, fatty acid monoglyceride and the like.

Examples of the amphoteric surfactant include an amino acid, alkylamino fatty acid salt, alkylbetaine, alkylamine oxide, polyacrylamide and the like.

Examples of the cationic surfactant include alkyltrimethylammonium salt, dialkyldimethylammonium salt, alkyldimethylbenzylammonium salt, N-methylbishydroxyethylamine fatty acid ester hydrochloric acid salt, halogenated alkylpyridinium and the like.

Further, as a separately classified surfactant, a fluorinated surfactant, a reactive surfactant such as an allyl reactive surfactant, and a polymeric surfactant such as a cationic cellulose derivative, polycarboxylic acid, and polystyrene sulfonic acid are also known. These are also commercially available as a wetting and dispersing additive. Thus, including these wetting and dispersing additives, any one of the surfactants described above can be used as a protective material of the present invention. Examples of a commercially available surfactant include EFKA5010, EFKA5044, EFKA5244, EFKA5054, EFKA5055, EFKA5063, EFKA5064, EFKA5065, EFKA5066, EFKA5070, EFKA5071, EFKA5207 (all manufactured by EFKA ADDITIVES), Disperbyk-101, Disperbyk-108, Disperbyk-130 (all manufactured by BYK-Chemie Japan) and the like.

These surfactants may be used alone or in combination of two or more thereof. Further, in the present invention, a combination of a surfactant and a protective material of the present invention other than a surfactant can be also used as a protective material for a conductive material.

As the coupling agent, a silane coupling agent, a titanate coupling agent, an aluminum coupling agent and the like are generally known, and any one of these can be used as a protective material of the present invention. Hereinafter, examples of a commercially available coupling agent that can be used in the present invention will be described. However, the coupling agent that can be used in the present invention is not limited to them.

Examples of the silane coupling agent include KA-1003, KBM-1003, KBE-1003, KBM-303, KBM-403, KBE-402, KBE403, KBM-1403, KBM-502, KBM-503, KBE-502, KBE-503, KBM-5103, KBM-602, KBM-603, KBE-603, KBM-903, KBE-903, KBE-9103, KBM-573, KBM-575, KBM-6123, KBE-585, KBM-703, KBM-802, KBM-803, KBE-846, KBE-9007 (all manufactured by Shin-Etsu Chemical Co., Ltd.) and the like.

Further, examples of the titanate coupling agent include PLENACT KR-TTS, PLENACT KR-46B, PLENACT KR-55, PLENACT KR-41B, PLENACT KR-38S, PLENACT KR-138S, PLENACT KR-238S, PLENACT 338X, PLENACT KR-44, PLENACT KR-9SA (all manufactured by Ajinomoto Fine-Techno, Inc.) and the like.

Examples of the aluminum coupling agent include PLENACT AL-M (manufactured by Ajinomoto Fine-Techno, Inc.) and the like.

These coupling agents may be used alone or in combination of two or more thereof. Further, in the present invention, a coupling agent may also be used in combination with a protective material of the present invention other than the coupling agent.

Fatty acids that can be used in the present invention are not specifically limited and any generally known fatty acids may be used. Examples thereof include a linear saturated fatty acid, a linear unsaturated fatty acid, a branched fatty acid, a tertiary fatty acid and the like.

Examples of the linear saturated fatty acid include propionic acid, butyric acid, valeric acid, caproic acid, enanthic acid, caprylic acid, pelargonic acid, capric acid, undecylic acid, lauric acid, tridecylic acid, myristic acid, pentadecylic acid, palmitic acid, heptadecylic acid, stearic acid, nonadecanoic acid, arachinic acid, behenic acid, lignoceric acid, cerotic acid, heptacosanoic acid, montanic acid, melissic acid, laccellic acid and the like.

Examples of the linear unsaturated fatty acid include acrylic acid, crotonic acid, isocrotonic acid, undecylenic acid, oleic acid, elaidic acid, cetoleic acid, erucic acid, brassidic acid, sorbic acid, linoleic acid, linolenic acid, arachidonic acid, propyolic acid stearolic acid and the like. Among them, considering stability and decompositionability at low temperature, caproic acid, enanthic acid, caprylic acid, myristic acid, oleic acid, stearic acid and the like can be mentioned.

Examples of the branched fatty acid include isobutyric acid, isovaleric acid, 2-ethyl hexanoic acid, 2-ethyl isohexanoic acid, 2-propyl heptanoic acid, 2-butyl octanoic acid, 2-isobutyl isooctanoic acid, 2-pentyl nonanoic acid, 2-isopentyl nonanoic acid, 2-hexyl decanoic acid, 2-hexyl isodecanoic acid, 2-butyl dodecanoic acid, 2-isobutyl dodecanoic acid, 2-heptyl undecanoic acid, 2-isoheptyl undecanoic acid, 2-isopeptyl isoundecanoic acid, 2-dodecyl hexanoic acid, 2-isododecyl hexanoic acid, 2-octyl dodecanoic acid, 2-isooctyl dodecanoic acid, 2-octyl isododecanoic acid, 2-nonyl tridecanoic acid, 2-isononyl isotridecanoic acid, 2-decyl dodecanoic acid, 2-isodecyl dodecanoic acid, 2-decyl isododecanoic acid, 2-decyl tetradecanoic acid, 2-octyl hexadecanoic acid, 2-isooctyl hexadecanoic acid, 2-undecyl pentadecanoic acid, 2-isoundecyl pentadecanoic acid, 2-dodecyl heptadecanoic acid, 2-isododecyl isoheptadecanoic acid, 2-decyl octadecanoic acid, 2-decyl isooctadecanoic acid, 2-tridecyl heptadecanoic acid, 2-isotridecyl isoheptadecanoic acid, 2-tetradecyl octadecanoic acid, 2-isotetradecyl octadecanoic acid, 2-hexadecyl hexadecanoic acid, 2-hexadecyl tetradecanoic acid, 2-hexadecyl isohexadecanoic acid, 2-isohexadecyl isohexadecanoic acid, 2-pentadecyl nonadecanoic acid, 2-isopentadecyl isononadecanoic acid, 2-tetradecyl behenic acid, 2-isotetradecyl behenic acid, 2-tetradecyl isobehenic acid, 2-isotetradecyl isobehenic acid, isoheptanoic acid, isomyristic acid, isopalmitic acid, isostearic acid, isoarachinic acid and the like.

Examples of the tertiary fatty acid include pivalic acid, neononanoic acid, neodecanoic acid, EQUACID 9 (manufactured by Idemitsu Petro-chemical Co., Ltd.), EQUACID 13 (manufactured by Idemitsu Petro-chemical Co., Ltd.) and the like.

It is preferred to use fatty acids having carbon atoms of 3 to 22. In addition, the fatty acids may be used alone or in combination of two or more thereof. Further, a combination of the fatty acid and a protective material of the present invention other than the fatty acid may also be used.

As a method of coating the protective material on the conductive material, various methods have been known including that a pre-formed conductive material and the protective material are admixed with each other via dry or wet method to coat the conductive material with the protective material, a conductive material is formed in the presence a protective material to obtain the conductive material covered with the protective material, and metal salts of materials working as protective materials such as fatty acid are reduced by a reducing agent and so on to obtain a conductive material covered with the protective material. All of these methods are previously known and any suitable method therein may be used.

In addition, a dispersion of fine metal particles obtained by reducing a metallic compound with carbodihydrazide represented by the following formula (1) or polybasic acid polyhydrazides represented by the following formula (2) in a liquid medium is preferably used in the present invention (for more detailed information, see PCT/JP2006/320493). According to this method, agglomeration of fine metal particles after the reaction is inhibited and fine metal particle with a small and uniform particle diameter can be obtained since a reduction reaction proceeds rapidly without heating to high temperature. As a result, a dispersion of the fine metal particles obtained by such method is excellent in fluidity and stability, and when it is used as, for example, an ink, a conductive circuit pattern with low volume resistance may be obtained even when it is dried at low temperature. By using metal salts of fatty acid as a metal salt in the method, fine metal particles covered with a protective material containing fatty acids can be produced directly. In addition, since properties of fine metal particles obtained according to this method are excellent, the fine metal particles obtained according to this method can be preferably used as a conductive material in the present invention.

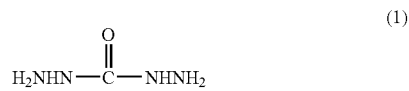

(1)

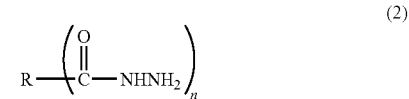

(2)

In the formula, R represents an n-valent polybasic acid residue.

Examples of the polybasic acid polyhydrazides that is represented by the formula (2) above include dibasic acid dihydrazides, tribasic acid trihydrazides, tetrabasic acid tetrahydrazides and the like. Specifically, examples of the dibasic acid dihydrazides include malonic acid dihydrazide, succinic acid dihydrazide, glutaric acid dihydrazide, adipic acid dihydrazide, sebacic acid dihydrazide, dodecanoic acid dihydrazide, isophthalic acid dihydrazide, terephthalic acid dihydrazide, tartaric acid dihydrazide, pimellic acid dihydrazide, suberic acid dihydrazide, azelaic acid dihydrazide, hexadecanoic acid dihydrazide, 2,6-naphthoic acid dihydrazide, 1,4-naphthoic acid dihydrazide, malic acid dihydrazide, iminodiacetic acid dihydrazide, itaconic acid dihydrazide and the like.

Examples of the tribasic acid trihydrazides include citric acid trihydrazide, trimellitic acid trihydrazide, nitriloacetic acid trihydrazide, cyclohexane tricarboxylic acid trihydrazide and the like. Examples of the tetrabasic acid tetrahydrazides include ethylenediamine tetraacetic acid tetrahydrazide, pyromellitic acid tetrahydrazide and the like. As additional polybasic acid polyhydrazides other than the hydrazides described above, polyacrylic acid polyhydrazide and the like can be mentioned.

An example of the method for producing the conductive fine particles relates to dissolving metal salts of fatty acid as a metallic compound in a non-aqueous solvent such as toluene which forms a separate phase from water, adding dropwise thereto an aqueous solution containing carbodihydrazide represented by the above formula (1) or polybasic acid polyhydrazides represented by the above formula (2) to reduce the metal salts of fatty acid, separating and removing an aqueous phase from a non-aqueous dispersion of fine particles obtained after the reaction, and then washing the non-aqueous solvent phase with water to obtain a dispersion of fine metal particles covered with fatty acids free of any impurities.

The total amount of the protective material used is preferable 1 to 2,000 parts by weight, more preferably 10 to 100 parts by weight compared to 100 parts by weight of a conductive material. The reason is that when the protective material is used in an amount of less than 1 part by weight, no protective effect by the protective material may be obtained and conductive fine particles obtained tend to agglomerate. On the other hand, when it is used in an amount of more than 2,000 parts by weight, the presence of an excess amount of protective material which does not contribute to the stabilization gives a bad influence on physical properties or conductivity when the resulting composition is used as a conductive ink and the like, and therefore undesirable.

(B) Material Having Anion Exchange Ability

Next, the material having anion exchange ability, which is brought into contact with a conductive material covered with a protective material, will be explained.

The material having anion exchange ability means a material that gives an anion exchange reaction in the present invention. An anion exchange reaction is a phenomenon in which ions contained in a solid or a liquid are exchanged with other ions having the same polarity existing in an external solution that is in contact with the subject ions. The material having anion exchange ability, which is used in the present invention, includes one that has an ionic group that takes part in an exchange of anions, that is an anion exchange group, in a molecule. Examples of the ionic group that takes part in an exchange of anions, i.e. the anion exchange group include an ammonium group, a phosphonium group, a sulfonium group, and an amino group, as well as a primary amine, a secondary amine and a tertiary amine.

We believe that the reason why even when a coating film is formed at low temperature such as room temperature, the conductive material is rapidly formed into a coating film so that conductivity can be expressed is as follows. That is, in the present invention, the conductive material is dispersed in a stabilized state by being covered with a protective material of the present invention. When being brought into contact with the material having anion exchange ability, the protective material is stripped from the surface of the conductive material by the material having anion exchange ability, or is exchanged with ions such as $F^-$, $Cl^-$, $Br^-$, $I^-$, $ClO_4^-$, $ClO_3^-$, $SO_4^{2-}$, $NO_3^-$, $CrO_4^-$, $CO_3^{2-}$, $PO_4^{3-}$, $HPO_4^{2-}$, $H_2PO_4^-$, $OH^-$ and the like, resulting in exposure of the surface of conductive material with a high activation energy. As a result, the conductive material becomes to lose dispersion stability, and is gotten easily agglomerated and fused.

Examples of the material having anion exchange ability of the present invention include an anion exchange resin, a cationic compound such as a cation activating agent, an inorganic anion exchanger and the like.

An anion exchange resin may be generally prepared by chloromethylation of a cross-linked polymer compound consisting of a styrene/divinyl benzene copolymer, followed by amination. A chloromethyl group can be easily introduced by reaction of chloromethyl ether in the presence of anhydrous aluminum chloride catalyst. The amination is a reaction in which a chloromethyl group is treated with amine. Depending on the types of amine used, various kinds of an anion exchange resin are produced. The anion exchange resin includes a strong base anion exchange resin and a weak base anion exchange resin, and it is said that the resin into which a quaternary ammonium group is introduced by use of triethylamine is strong basic type I and the resin into which a quaternary ammonium group is introduced by use of dimethylethanolamine is strong basic type II. If a primary amine, a secondary amine or a tertiary amine is introduced into the resin, a weak base ion resin is obtained. Further, the styrene/divinyl benzene copolymer is obtained by suspension polymerization. A copolymer of transparent and homogeneous spherical particles is generally called a gel type while a porous one that is obtained by adding an organic solvent with high boiling point, such as water-insoluble aromatic hydrocarbons and the like, is called a macroporous type, and a porous body that is obtained by adding an organic solvent such as 2-butanol which hardly causes any swelling of a product polymer is called MR type resin. Any kind of anion exchange resins including these anion exchange resins may be used as the material having anion exchange ability in the present invention.

Meanwhile, examples of the cationic compound include a quaternary ammonium salt, a compound having a quaternary ammonium salt and the like. The quaternary ammonium salt may be prepared generally by reacting a tertiary amine with a halogenated alkyl compound. Examples of the quaternary ammonium salt include a cyclic quaternary ammonium salt such as N-methyl piperidine metiodide and quionoline metiodide, which have a nitrogen atom in the ring, and a cationic activating agent such as chlorobenzalkonium, chlorobenzethonium, halogenated alkyltrimethyl ammonium, halogenated alkyl pyridinium, and halogen acid salt of higher amines. Any of these may be used as the material having anion exchange ability of the present invention.

In addition, resin compounds into which the above mentioned quaternary ammonium salt is introduced, or other resin compounds into which an ammonium group, a phosphonium group, a sulfonium group, an amino group, a primary amine, a secondary amine or a tertiary amine are introduced may be also used in the same manner. Examples of the resin compound include an acrylic resin, a urethane resin, a polyamine resin, an acrylamide resin, a polymerized allylamine resin, a polymerized diallylamine resin and the like. Further, a polymerized dicyandiamidine or dicyandiamide resin, a cation modified resin in which the resin is directly modified by cations, and resin beads that are prepared by cross-linking polymerized allylamine resins are exemplified, and these resins may be also used in the present invention.

Examples of the acid group of quaternary ammonium salt include $F^-$, $Cl^-$, $Br^-$, $I^-$, $ClO_4^-$, $ClO_3^-$, $SO_4^{2-}$, $NO_3^-$, $CrO_4^-$, $CO_3^{2-}$, $PO_4^{3-}$, $HPO_4^{2-}$, $H_2PO_4^-$, $OH^-$ and the like and any one of them may be used.

Examples of the inorganic ion exchanger, so called a solid base, include activated charcoal, metal oxides such as tin oxide, magnesium oxide, calcium oxide, strontium oxide, barium oxide, aluminum oxide, zirconium oxide, and titanium dioxide, metal carbonates such as magnesium carbonate and calcium carbonate, composite oxides such as $ZnO/ZrO_2$, $MgO/TiO_2$, $CaO/P_2O_5$, $SiO_2/CaO/MgO$, $SiO_2/Al_2O_3$, $SiO_2/SrO$, $SiO_2/BaO$, $ZnO/SiO_2$, $TiO_2/ZrO_2$, $Al_2O_3/TiO_2$, $SiO_2/ZrO_2$, $Al_2O_3+ZrO_2$, $SiO_2/TiO_2$, $MoO_3/SiO_2$, $MoO_3/Al_2O_3$, and $Al_2O_3/MgO$, zeolite, metal-deposited metal oxides such as $Na/MgO$, and $K/MgO$, $Na/Al_2O_3$, imine-supported metal oxides such as $KNH_2/Al_2O_3$ and $EuNH/K$—Y, alkali metal salts such as $KF/Al_2O_3$ and $LiCO_3/SiO_2$, and the like. Further, a material obtained by that aluminum oxide and the like are coated on silica, colloidal silica or titania and then make the charge on the surface materials cationic may also be used as the inorganic ion exchanger.

The above material having anion exchange ability may be used alone or in combination of two or more thereof.

(C) Composition for Forming Coating Film (C-1) Composition for Forming Coating Film Layer Containing Conductive Material First, a composition for forming a coating film layer containing a conductive material, which is used to form a coating film layer containing a conductive material covered with a protective material of the present invention, will be explained.

The conductive material covered with a protective material, which is used in the present invention, can be prepared according to various methods as described above. When a conductive material covered with a protective material is directly obtained as a solvent dispersion according to a production method used, it may be used as a composition for forming a coating film layer containing a conductive material. However, when a conductive material covered with a protective material is not directly obtained as a solvent dispersion, it may be dispersed with various liquid media within the limit that the solubility of the protective material covering a conductive material is not impaired to prepare a conductive material dispersion. In addition, when it is desired to improve the properties of a composition, a resin and/or its precursor and other additives may be added to a conductive material covered with a protective material to provide a composition for forming a coating film layer which contains a conductive material, if necessary. The above "other additives" include an anti-foaming agent, a leveling agent, a lubricant, a dispersing agent and the like. The composition for forming a coating film is referred to as a coating material, an ink etc. depending on a coating method employed. For example, when applied by a coater, impregnation, spraying or the like, the composition for forming a coating film is referred to as, for example, a coating material or an ink according to circumstances, and when printed by a printing machine, a printing device or the like, it is referred to as an ink. Further, a liquid medium, a resin and/or its precursor, other additives and the like are appropriately selected so as to obtain a composition suitable for a coating method selected. A composition with the optimal properties for the coating method employed is obtained by selection of the conductive material covered with a protective material, the resin and/or its precursor, other additives and the like in the present invention.

Conductive fine particle dispersion of the composition for forming a coating layer film containing a conductive material obtained may be applied to various types of printing methods such as gravure printing, flexographic printing, and ink-jet printing and other various coating methods as a conductive ink or a conductive coating material.

Examples of the liquid medium used in the composition for forming a coating film layer containing a conductive material of the present invention include an ester solvent, a ketone solvent, a glycol ether solvent, a hydrocarbon solvent, an aromatic solvent, an alcohol solvent, a glycol solvent, an ether solvent, a cyclic ether solvent, water and the like. These solvents may be used alone or in combination of two or more thereof. Hereinafter, these solvents will be explained in more detail.

Examples of the ester solvent include ethyl formate, propyl formate, butyl formate, isobutyl formate, pentyl formate, methyl acetate, ethyl acetate, n-propyl acetate, isopropyl acetate, n-butyl acetate, isobutyl acetate, sec-butyl acetate, (iso)amyl acetate, cyclohexyl acetate, ethyl lactate, 3-methoxybutyl acetate, sec-hexyl acetate, 2-ethylbutyl acetate, 2-ethylhexyl acetate, benzyl acetate, methyl propionate, ethyl propionate, methyl monochloroacetate, ethyl monochloroacetate, butyl monochloroacetate, methyl acetoacetate, ethyl acetoacetate, butyl propionate, isoamyl propionate, 7-butyrolactone and the like. Examples of the ketone solvent include acetone, acetophenone, methyl ethyl ketone, methyl propyl ketone, diethyl ketone, methyl n-butyl ketone, methyl isobutyl ketone, dipropyl ketone, diisobutyl ketone, methyl amyl ketone, acetonylacetone, isophorone, cyclohexanone, methylcyclohexanone, 2-(1-cyclohexenyl)cyclohexanone and the like.

Examples of the glycol ether solvent include ethylene glycol monoethyl ether, ethylene glycol monoisopropyl ether, ethylene glycol monobutyl ether, diethylene glycol monoethyl ether, diethylene glycol mono n-butyl ether, propylene glycol monomethyl ether, propylene glycol monoethyl ether, propylene glycol mono n-propyl ether, propylene glycol mono n-butyl ether, dipropylene glycol monomethyl ether, dipropylene glycol monoethyl ether, dipropylene glycol mono n-propyl ether, dipropylene glycol mono n-butyl ether, triethylene glycol monomethyl ether, triethylene glycol monoethyl ether, triethylene glycol mono n-propyl ether, triethylene glycol mono n-butyl ether, tripropylene glycol monoethyl ether, tripropylene glycol mono n-propyl ether, tripropylene glycol mono n-butyl ether, and acetic acid esters of these monoethers, and dialkyl ethers such as diethylene glycol dimethyl ether, diethylene glycol diethyl ether, diethylene glycol methylisobutyl ether, dipropylene glycol dimethyl ether, dipropylene glycol diethyl ether and the like.

Examples of the aliphatic solvent include a normal paraffinic solvent such as n-hexane, n-heptane, n-octane, n-nonane, n-decane, n-dodecane, No. 0 solvents L, M and H (all manufactured by Nippon Oil Corporation), Normal paraffin SL, L, and M (all manufactured by Nippon Oil Corporation), and an isoparaffinic solvent such as isohexane, 2,2,3-trimethylpentane, isooctane, 2,2,5-trimethylhexane, ISOSOL 200, 300, and 400 (all manufactured by Nippon Oil Corporation), SUPERSOL FP2, 25, 30, and 38 (all manufactured by Idemitsu Kosan Co., Ltd.), a cycloparaffinic solvent such as cyclopentane, methyl cyclopentane, cyclohexane, methyl cyclohexane, ethyl cyclohexane, Naphthesol 160, 200, and 220 (all manufactured by Nippon Oil Corporation), AF solvent No. 4, No. 5, No. 6, and No. 7 (all manufactured by Nippon Oil Corporation), tetrahydronaphthalene, decahydronaphthalene, turpentine oil, limonene, Industrial gasoline No. 1, No. 2, No. 3, No. 4, and No. 5, ligroin and the like.

Examples of the aromatic solvent include toluene, xylene, ethylbenzene, naphthalene, tetraline, naphtha solvent, hydrocarbons mixed with aromatic compounds and the like.

Examples of the alcohol solvent include methanol, ethanol, n-propyl alcohol, isopropyl alcohol, n-butyl alcohol, isobutyl alcohol, sec-butyl alcohol, t-butyl alcohol, heptanol, n-amyl alcohol, sec-amyl alcohol, n-hexyl alcohol, tetrahydrofurfuryl alcohol, furfuryl alcohol, allyl alcohol, ethylene chlorohydrin, octyl dodecanol, 1-ethyl-1-propanol, 2-methyl-1-butanol, isoamyl alcohol, t-amyl alcohol, sec-isoamyl alcohol, neoamyl alcohol, hexyl alcohol, 2-methyl-1-pentanol, 4-methyl-2-pentanol, heptyl alcohol, n-octyl alcohol, 2-ethylhexyl alcohol, nonyl alcohol, decyl alcohol, undecyl alcohol, lauryl alcohol, benzyl alcohol, alfa-terpineol, cyclohexanol, 3-methoxybutanol, diacetone alcohol, 1,4-butanediol, octanediol and the like, or branched higher alcohols such as FINE OXOCOL 140N, FINE OXOCOL 1600, FINE OXOCOL 180, FINE OXOCOL 180N, and FINE OXOCOL 2000 (all manufactured by Nissan Chemical Industries, Ltd.) and the like.

Examples of the glycol solvent include ethylene glycol, diethylene glycol, triethylene glycol, propylene glycol, 1,3-butylene glycol, hexylene glycol, polyethylene glycol, dipropylene glycol and the like.

Examples of the ether solvent include ethyl ether, isopropyl ether, dioxane, dibutyl ether, methyl-t-butyl ether and the like.

Examples of the cyclic ether solvent include tetrahydrofuran, 1,3-dioxolane and the like. Further, additional liquid media include dimethyl carbonate, ethylmethyl carbonate, di-n-butyl carbonate, furfural and the like.

Although it may vary depending on conditions including materials which are used for a composition for forming a coating film layer containing a conductive material and methods of forming a coating film, the above liquid media may be used generally in an amount of 0.01 to 99% by weight, preferably 0.1 to 95% by weight in 100% by weight of a composition for forming a coating film layer containing a conductive material.

The resin and/or its precursor which is included in a composition for forming a coating film layer containing a conductive material of the present invention is used in order to improve adhesiveness to a substrate or adhesiveness of a conductive ink, a conductive coating material and the like to a composition for forming a coating film layer containing a material having anion exchange ability, or to improve a film forming property of the conductive ink, the conductive coating material and the like. Examples thereof include polyurethane resin, (unsaturated) polyester resin, alkyd resin, butyral resin, acetal resin, polyamide resin, (meth)acryl resin, styrene/(meth)acryl resin, polystyrene resin, nitrocellulose, benzyl cellulose, cellulose (tri)acetate, casein, shellac, gelatin, gilsonite, rosin, rosin ester, polyvinyl alcohol, polyvinyl pyrrolidone, polyacrylamide, hydroxyethyl cellulose, hydroxypropyl cellulose, methyl cellulose, ethyl cellulose, hydroxyethylmethyl cellulose, hydroxypropylmethyl cellulose, carboxymethyl cellulose, carboxymethylethyl cellulose, carboxymethyl nitrocellulose, ethylene/vinyl alcohol resin, styrene/anhydrous maleic acid resin, polybutadiene resin, polylvinyl chloride resin, polychlorovinylidene resin, polyfluorovinylidene resin, polyvinyl acetate resin, ethylene/vinyl acetate resin, vinyl chloride/vinyl acetate resin, vinyl chloride/vinyl acetate/maleic acid resin, fluororesin, silicone resin, epoxy resin, phenoxy resin, phenol resin, maleic acid resin, urea resin, melamine resin, benzoguanamine resin, ketone resin, petroleum resin, chlorinated polyolefin resin, modified chlorinated polyolefin resin, chlorinated polyurethane resin and the like.

Examples of the resin precursor include a compound having an ethylenic unsaturated double bond such as (meth) acrylic acid, (meth)acrylate compound, vinyl ether compound and the like. These compounds with an ethylenic unsaturated double bond may be either monofunctional or polyfunctional. These compounds may be used alone or in combination of two or more thereof. In addition, in the present invention, the term "(meth)acrylic acid" means that it includes both acrylic acid and methacrylic acid. Further, the term "(meth)acrylate" means that it includes both acrylate and methacrylate. The same is applied for other (meth)acryloyl and the like.

Among (meth)acrylate compounds, examples of a monofunctional (meth)acrylate compound include methyl(meth) acrylate, ethyl(meth)acrylate, n-butyl(meth)acrylate, isobutyl(meth)acrylate, t-butyl(meth)acrylate, butanediol monoacrylate, 2-(dimethylamino)ethyl(meth)acrylate, 2-(diethylamino)-ethylmethacrylate, 2-hydroxyethyl(meth)acrylate, 2-hydroxypropyl(meth)acrylate, 4-hydroxybutyl(meth) acrylate, 2-methoxyethylacrylate, N-vinylcaprolactam, N-vinylpyrrollidone, acryloylmorpholine, N-vinylformamide, cyclohexyl(meth)acrylate, dicyclopentanyl(meth) acrylate, glycidyl(meth)acrylate, isobonyl(meth)acrylate, phenoxy(meth)acrylate, isodecyl(meth)acrylate, lauryl (meth)acrylate, tetrahydrofurfuryl(meth)acrylate, 2-phenoxyethyl(meth)acrylate, isooctyl(meth)acrylate, methoxytriethylene glycol acrylate, 2-ethoxyethylacrylate, 3-methoxybutylacrylate, benzyl(meth)acrylate, 2-(2-ethoxyethoxy)ethylacrylate, butoxyethylacrylate, ethoxydiethylene glycol acrylate, methoxydipropylene glycol acrylate, methylphenoxyethyl acrylate, dipropylene glycol (meth)acrylate, (meth)acryloyloxyethyl succinate, 2-(meth)acryloyloxyethyl 2-hydroxypropyl phthalate, 2-acryloyloxyethylhexahydrophthalate, 2-hydroxy-3-acryloyloxypropyl (meth)acrylate, 2-methacryloyloxyethyl isocyanate and the like.

Examples of a polyfunctional (meth)acrylate compound include ethylene glycol di(meth)acrylate, diethylene glycol di(meth)acrylate, 1,6-hexanediol di(meth)acrylate, ethoxylated 1,6-hexanediol diacrylate, neopentylglycol di(meth) acrylate, ethoxylated neopentylglycol di(meth)acrylate, propoxylated neopentylglycol di(meth)acrylate, tripropylene glycol di(meth)acrylate, polypropylene glycol diacrylate, 1,4-butanediol di(meth)acrylate, 1,9-nonanediol diacrylate, tetraethylene glycol diacrylate, 2-n-butyl-2-ethyl-1,3-propanediol diacrylate, dimethyloltricyclodecane diacrylate, hydroxypivalic acid neopentylglycol diacrylate, 1,3-butylene glycol di(meth)acrylate, ethoxylated bisphenol A di(meth) acrylate, propoxylated bisphenol A di(meth)acrylate, cyclohexane dimethanol di(meth)acrylate, dimethyloldicyclopentane diacrylate, trimethylolpropane triacrylate, ethoxylated trimethylolpropane triacrylate, propoxylated trimethylolpropane triacrylate, pentaerythritol triacrylate, tetramethylolpropane triacrylate, tetramethylolmethane triacrylate, pentaerythritol tetraacrylate, caprolactone modified trimethylolpropane triacrylate, ethoxylated isocyanuric acid triacrylate, tri(2-hydroxyethylisocyanurate)-triacrylate, propoxylate glyceryl triacrylate, tetramethylolmethane tetraacrylate, pentaerythritol tetraacrylate, ditrimethylolpropane tetraacrylate, ethoxylated pentaerythritol tetraacrylate, dipentaerythritol hexaacrylate, neopentylglycol oligoacrylate, 1,4-butanediol oligoacrylate, 1,6-hexanediol oligoacrylate, trimethylolpropane oligoacrylate, pentaerythritol oligoacrylate, urethane acrylate, epoxy acrylate, polyester acrylate, rosin modified acrylate and the like.

Among vinyl ether compounds, examples of a monofunctional vinyl ether compound include hydroxyethyl vinyl ether, hydroxybutyl vinyl ether, cyclohexanedimethanol monovinyl ether, cyclohexyl vinyl ether and the like. In addition, examples of a polyfunctional vinyl ether compound include ethylene glycol divinyl ether, diethylene glycol divinyl ether, triethylene glycol divinyl ether, pentaerythritol divinyl ether, propylene glycol divinyl ether, dipropylene glycol divinyl ether, neopentylglycol divinyl ether, 1,4-butanediol divinyl ether, 1,6-hexanediol divinyl ether, trimethylolpropane divinyl ether, 1,4-dihydroxycyclohexane divinyl ether, 1,4-dihydroxymethylcyclohexane divinyl ether, bisphenol A diethoxydivinyl ether, glyceroltrivinyl ether, sorbitol tetravinyl ether, trimethylol propane trivinyl ether, pentaerythritol trivinyl ether, pentaerythritol tetravinyl ether, dipentaerythritol hexavinyl ether, ditrimethylolpropane tetravinyl ether and the like.

Further, as compounds having an ethylenic unsaturated double bond other than the compounds described above, there are exemplified N-vinylacetamide, tris(acryloxyethyl)-isocyanurate, polyethylene glycol dimethacrylate, methoxypolyethylene glycol methacrylate, tribromophenyl(meth) acrylate, pentaerythritol diacrylate monostearate, 2-metharyloyloxyethylhexahydrophthalate, stearyl acrylate, tetramethylpiperidyl methacrylate and the like can be mentioned.

These resins and/or their precursors may be used within the limit that the conductivity of a conductive material covered with a protective material is not impaired. Although it may vary depending on various conditions including a type of a conductive coated material, a type of a substrate to which coated film is formed, composition of a neighboring layer, a method of forming a coating film, and the nature of a resin or its precursor used and the like, the resins or their precursors may be used in an addition amount of 0.01 to 99% by weight, preferably 0.1 to 95% by weight in 100% by weight of the composition for forming a coating film layer containing a conductive material.

Examples of the anti-foaming agent which may be used in the composition for forming a coating film layer containing a conductive material of the present invention include Surfynol DF-70, Surfynol DF-75, Surfynol DF-210, Surfynol DF-695 (all manufactured by Air Products Japan, Inc.), EFKA2022, EFKA2023, EFKA2025, EFKA2028, EFKA2035, EFKA2038, EFKA2040, EFKA2048, EFKA2527, EFKA2550, EFKA2721, EFKA2722, EFKA2723 (all manufactured by EFKA Additives), BYK-051, BYK-052, BYK-053, BYK-054, BYK-055, BYK-057, BYK-1752, BYK-1790, BYK-060N, BYK-063, BYK-065, BYK-067A, BYK-070, BYK-077, BYK-080A, BYK-088, BYK-141, BYK-354, BYK-392, BYK-011, BYK-012, BYK-017, BYK-018, BYK-019, BYK-020, BYK-021, BYK-022, BYK-023, BYK-024, BYK-025, BYK-028, BYK-038, BYK-044, BYK-080A, BYK-094, BYK-1610, BYK-1615, BYK-1650, BYK-1730, BYK-1770 (all manufactured by BYK-Chemie Japan), Disparlon OX-880EF, Disparlon OX-881, Disparlon OX-883, Disparlon OX-77EF, Disparlon OX-710, Disparlon OX-8040, Disparlon 1922, Disparlon 1927, Disparlon 1950, Disparlon 1951, Disparlon P-410EF, Disparlon P-420, Disparlon P-425, Disparlon PD-7 (all manufactured by Kusumoto Chemicals Ltd.) and the like. The anti-foaming agent may be used in an addition amount of 0.005 to 10% by weight, preferably 0.01 to 5% by weight in 100% by weight of the composition for forming a coating film layer containing a conductive material.

Examples of the leveling agent which may be used in the composition for forming a coating film layer containing a conductive material of the present invention include Surfynol 104PA, Surfynol 420, Surfynol 440, Surfynol 465, Surfynol 485, Surfynol 504, Surfynol SE-F (all manufactured by Air Products Japan, Inc.), EFKA3030, EFKA3031, EFKA3033, EFKA3034, EFKA3035, EFKA3232, EFKA3236, EFKA3239, EFKA3299, EFKA3522, EFKA3523, EFKA3580, EFKA3835, EFKA3883, EFKA3886, EFKA3888, EFKA3277, EFKA3500, EFKA3570, EFKA3600, EFKA3650, EFKA3772, EFKA3777, EFKA3778 (all manufactured by EFKA Additives), BYK-300, BYK-302, BYK-306, BYK-307, BYK-310, BYK-315, BYK-320, BYK-322, BYK-323, BYK-325, BYK-330, BYK-331, BYK-333, BYK-337, BYK-340, BYK-344, BYK-370, BYK-375, BYK-377, BYK-350, BYK-352, BYK-354, BYK-355, BYK-358N, BYK-361N, BYK-392, BYK-UV3500, BYK-UV3510, BYK-UV3570, BYK-Siclean3700, BYK-301, BYK-341, BYK-345, BYK-346, BYK-347, BYK-348, BYK-380N, BYK-381, Byketol-OK, Byketol-Special, Byketol-WS (all manufactured by BYK-Chemie Japan), Disparlon 1970, Disparlon 230, Disparlon LF-1970, Disparlon LF-1982, Disparlon LF-1983, Disparlon LF-1984, Disparlon LF-1985 (all manufactured by Kusumoto Chemicals Ltd.) and the like. The leveling agent may be used in an addition amount of 0.005 to 10% by weight, preferably 0.01 to 5% by weight in 100% by weight of the composition for forming a coating film layer containing a conductive material.

Examples of the lubricant which may be used for the composition for forming a coating film layer containing a conductive material of the present invention include CERAFLOUR914, CERAFLOUR915, CERAFLOUR916, CERAFLOUR950, CERAFLOUR970, CERAFLOUR980, CERAFLOUR988, CERAFLOUR990, CERAFLOUR991, CERAFLOUR994, CERAFLOUR995, CERAFLOUR996, CERAFLOUR998, AQUACER498, AQUACER515, AQUACER526, AQUACER531, AQUACER537, AQUACER539, AQUACER593, AQUAMAT263, AQUAMAT270, CERACOL79, CERACOL601, CERAFAK103, CERAFAK106, CERAFAK110, CERATIX8461, CERATIX8463 (all manufactured by BYK-Chemie Japan) and the like. The lubricant may be used in an addition amount of 0.005 to 10% by weight, preferably 0.01 to 5% by weight in 100% by weight of the composition for forming a coating film layer containing a conductive material.

A dispersing agent which may be used for the composition for forming a coating film layer containing a conductive material of the present invention include a pigment dispersing agent, a surfactant and the like that have been exemplified as a protective material in the above. The dispersing agent can be used in an addition amount of 0.01 to 99% by weight, preferably 0.1 to 95% by weight in 100% by weight of a composition for forming a coating film containing a conductive material.

In order to prepare a composition for forming a coating film layer containing a conductive material of the present invention, a conductive material covered with a protective material is mixed with a liquid medium, an anti-foaming agent, a leveling agent, a lubricant, a dispersing agent, a resin and/or its precursor and the like if necessary, dispersed according to a conventionally known method such as a method using a ball mill, an attriter, a sand mill, a jet mill, a triple-roll mill, a paint shaker and the like or stirred and mixed according to a conventionally known method such as a method using a mixer or a dissolver.

(C-2) Composition for Forming Coating Film Containing Material Having Anion Exchange Ability (Composition for Forming Anion Exchange Layer)

Next, a composition for forming a coating film containing a material having anion exchange ability (a composition for forming an anion exchange layer) will be explained.

The composition for forming an anion exchange layer may employ an appropriate liquid medium depending on a material having anion exchange ability to be used, a substrate to which coating is carried out, properties of a film of a composition for forming a coating film containing a conductive material when the composition for forming an anion exchange layer is coated onto the film, and a method for coating or printing the composition for forming an anion exchange layer. In addition, a composition for forming an anion exchange layer may be prepared by mixing a material having the anion exchange ability with the liquid medium, and it is mixed with an anti-foaming agent, a leveling agent, a lubricant, a dispersing agent, a resin and/or its precursor which is different from the resin having anion exchange ability, an inorganic or organic fine particles and the like with or without anion exchange ability if necessary, followed by dispersing them according to the method same as that used for preparing the composition for forming a coating film layer containing a conductive material, i.e., with a method using a ball mill, an attriter, a sand mill, a jet mill, triple-roll mill, a paint shaker and the like or by stirring and mixing them using a mixer or a dissolver.

The composition for forming an anion exchange layer may be prepared according to the method described in the above. Further, when the material having anion exchange ability is soluble in a liquid medium, it can be dissolved in a liquid medium under mixing and stirring and used. Still further, when the material having anion exchange ability is insoluble in a liquid medium, the material is dispersed with an aid of the above disperser, and if necessary, additives and other resin and the like as mentioned above may be added to form a composition for forming an anion exchange layer. Thus obtained composition for forming an anion exchange layer is used as a coating material, an ink and the like, similar to the composition for forming a coating film layer containing a conductive material, and also coated on a substrate and the like.

Examples of the liquid medium that is used for preparing the composition for forming an anion exchange layer include a liquid medium such as an ester solvent, a ketone solvent, a glycol ether solvent, an aliphatic solvent, an aromatic solvent, an alcohol solvent, a glycol solvent, an ether solvent, water and the like, similar to those that are exemplified as a liquid medium for preparing the composition for forming a coating film layer containing a conductive material. These solvents may be used in combination of two or more thereof. Specific examples of each of the solvents are the same as those that are exemplified as a liquid medium for preparing the composition for forming the coating film layer containing a conductive material. According to the present invention, in view of the solubility in a resin having ion exchange ability, water, an alcohol solvent, a glycol ether solvent, a glycol solvent, or a solvent mixture including the solvent and water is preferably used as a solvent for preparing a composition for forming an anion exchange layer. In addition, an anti-foaming agent, a leveling agent, a lubricant, a dispersing agent, and the like, that are used if required and the same as those exemplified for preparing the composition for forming a coating film layer containing a conductive material, may be used.

Meanwhile, other resin and/or its precursor which is different from a resin used as a material having anion exchange ability is added in order to improve adhesiveness of the composition for forming a coating film containing anion exchange ability to a substrate that is either coated or printed by the composition, to improve adhesiveness with the coating film containing a conductive material covered with a protective material, or to protect a formed conductive coating film. Examples of the other resins that are used under such purposes include polyurethane resin, saturated or unsaturated polyester resin, alkyd resin, butyral resin, acetal resin, polyamide resin, (meth)acryl resin, styrene/(meth)acryl resin, polystyrene resin, nitrocellulose, benzyl cellulose, cellulose (tri)acetate, casein, shellac, gelatin, gilsonite, rosin, rosin ester, polyvinyl alcohol, polyvinyl pyrrolidone, polyacrylamide, hydroxyethyl cellulose, hydroxypropyl cellulose, methyl cellulose, ethyl cellulose, hydroxyethylmethyl cellulose, hydroxypropylmethyl cellulose, carboxymethyl cellulose, carboxymethylethyl cellulose, carboxymethyl nitrocellulose, ethylene/vinylalcohol resin, styrene/anhydrous maleic acid resin, polybutadiene resin, polyvinyl chloride resin, polychlorovinylidene resin, polyfluorovinylidene resin, polyvinyl acetate resin, ethylene/vinyl acetate resin, vinyl chloride/vinyl acetate resin, vinyl chloride/vinyl acetate/maleic acid resin, fluoro resin, silicone resin, epoxy resin, phenoxy resin, phenol resin, maleic acid resin, urea resin, melamine resin, benzoguanamine resin, ketone resin, petroleum resin, chlorinated polyolefin resin, modified chlorinated polyolefin resin, chlorinated polyurethane resin and the like. These resins are appropriately selected depending on a substrate, a method for forming a coating film, and properties of a conductive coating film, etc. to achieve the above purposes of the addition. Among the resins, in view of adhesiveness of anion exchange coating film layer to a substrate and strength thereof, polyvinyl alcohol, polyvinylformal, polyvinylacetal, polyvinylbutyral, (meth)acryl resin, styrene/(meth)acryl resin, polyester resin, polyurethane resin and the like are preferable. These resins may be used alone or in combination of two or more.

Physical properties such as resistance to a solvent or resistance to a chemical of the resulting coating film can be improved by further using a hardening agent such as amines, acid anhydrides, mercaptans, imidazoles, isocyanates, dicyandiamides, dihydrazide and the like together with phenol resin, epoxy resin, mealmine resin, urea resin, polyester resin, alkyd resin and the like among the above resins.

Examples of the resin precursor include a compound having an ethylenic unsaturated double bond such as (meth) acrylic acid, (meth)acrylate compound, vinyl ether compound and the like. These compounds with an ethylenic unsaturated double bond may be either monofunctional or polyfunctional. These compounds may be used alone or in combination of two or more thereof.

Among (meth)acrylate compounds, examples of a monofunctional (meth)acrylate compound include methyl(meth) acrylate, ethyl(meth)acrylate, n-butyl(meth)-acrylate, isobutyl(meth)acrylate, t-butyl(meth)acrylate, butanediol monoacrylate, 2-(dimethylamino)ethyl(meth)-acrylate, 2-(diethylamino)ethylmethacrylate, 2-hydroxyethyl(meth) acrylate, 2-hydroxypropyl(meth)acrylate, 4-hydroxybutyl (meth)acrylate, 2-methoxyethylacrylate, N-vinylcaprolactam, N-vinylpyrrolidone, acryloylmorpholine, N-vinylformamide, cyclohexyl(meth)acrylate, dicyclopentanyl(meth)acrylate, glycidyl(meth)acrylate, isobonyl(meth) acrylate, phenoxy(meth)acrylate, isodecyl(meth)acrylate, lauryl(meth)acrylate, tetrahydrofurfuryl(meth)acrylate, 2-phenoxyethyl(meth)-acrylate, isooctyl(meth)acrylate, methoxytriethylene glycol acrylate, 2-ethoxyethyl acrylate, 3-methoxybutyl acrylate, benzyl(meth)acrylate, 2-(2-ethoxyethoxy)ethyl acrylate, butoxyethyl acrylate, ethoxydiethylene glycol acrylate, methoxydipropylene glycol acrylate, methylphenoxyethyl acrylate, dipropylene glycol (meth) acrylate, (meth)acryloyloxyethyl succinate, 2-(meth) acryloyloxyethyl 2-hydroxypropyl phthalate, 2-acryloyloxyethyl hexahydrophthalate, 2-hydroxy-3-acryloyloxypropyl (meth)acrylate, 2-methacryloyloxyethyl isocyanate and the like.

Further, examples of a polyfunctional (meth)acrylate compound include ethylene glycol di(meth)acrylate, diethylene glycol di(meth)acrylate, 1,6-hexanediol di(meth)acrylate, ethoxylated 1,6-hexanediol diacrylate, neopentylglycol di(meth)acrylate, ethoxylated neopentylglycol di(meth)acrylate, propoxylated neopentylglycol di(meth)acrylate, tripropylene glycol di(meth)acrylate, polypropylene glycol diacrylate, 1,4-butanediol di(meth)acrylate, 1,9-nonanediol diacrylate, tetraethylene glycol diacrylate, 2-n-butyl-2-ethyl-1,3-propanediol diacrylate, dimethyloltricyclodecane diacrylate, hydroxypivalic acid neopentylglycol diacrylate, 1,3-butylene glycol di(meth)acrylate, ethoxylated bisphenol A di(meth)acrylate, propoxylated bisphenol A di(meth)acrylate, cyclohexane dimethanol di(meth)acrylate, dimethyloldicyclopentane diacrylate, trimethylolpropane triacrylate, ethoxylated trimethylolpropane triacrylate, propoxylated trimethylolpropane triacrylate, pentaerythritol triacrylate, tetramethylolpropane triacrylate, tetramethylolmethane triacrylate, pentaerythritol tetraacrylate, caprolactone-modified trimethylolpropane triacrylate, ethoxylated isocyanuric acid triacrylate, tri(2-hydroxyethylisocyanurate)-triacrylate, propoxylate glyceryl triacrylate, tetramethylolmethane tetraacrylate, pentaerythritol tetraacrylate, ditrimethylolpropane tetraacrylate, ethoxylated pentaerythritol tetraacrylate, dipentaerythritol hexaacrylate, neopentylglycol oligoacrylate, 1,4-butane diol oligoacrylate, 1,6-hexane diol oligoacrylate, trimethylolpropane oligoacrylate, pentaerythritol oligoacrylate, urethane acrylate, epoxy acrylate, polyester acrylate, rosin-modified acrylate and the like.

Among vinyl ether compounds, examples of a monofunctional vinyl ether compound include hydroxyethyl vinyl ether, hydroxybutyl vinyl ether, cyclohexanedimethanol monovinyl ether, cyclohexyl vinyl ether and the like. In addition, examples of a polyfunctional vinyl ether compound include ethylene glycol divinyl ether, diethylene glycol divinyl ether, triethylene glycol divinyl ether, pentaerythritol divinyl ether, propylene glycol divinyl ether, dipropylene glycol divinyl ether, neopentylglycol divinyl ether, 1,4-butane diol divinyl ether, 1,6-hexane diol divinyl ether, trimethylolpropane divinyl ether, 1,4-dihydroxycyclohexane divinyl ether, 1,4-dihydroxymethylcyclohexane divinyl ether, bisphenol A diethoxy divinyl ether, glycerol trivinyl ether, sorbitol tetravinyl ether, trimethylolpropane trivinyl ether, pentaerythritol trivinyl ether, pentaerythritol tetravinyl ether, dipentaerythritol hexavinyl ether, ditrimethylolpropane tetravinyl ether and the like.

Further, as a compound having an ethylenic unsaturated double bond other than the compounds described above, N-vinylacetamide, tris(acryloxyethyl)isocyanurate, polyethylene glycol dimethacrylate, methoxypolyethylene glycol methacrylate, tribromophenyl(meth)acrylate, pentaerythritol diacrylate monostearate, 2-metharyloyloxyethyl hexahydrophthalate, stearyl acrylate, tetramethylpiperidyl methacrylate and the like can be mentioned.

When a composition for forming an anion exchange layer including a resin precursor is cured by irradiation with an electron beam, a molecular chain of a resin precursor (compound having an ethylenic unsaturated double bond) is broken, yielding a radical polymerization. On the other hand, when a resin is cured by irradiation with UV light, an initiator for photopolymerization is generally added to the composition for forming a coating film described above.

As the initiator for photopolymerization, benzophenone type, thioxanthone type, acetophenone type, benzoin type, acylphosphine oxide type, bisimidazole type, acridine type, carbazole-phenone type, triazin type, oxime type initiator for photopolymerization may be used. The initiator for photopolymerization may be used in an amount of 1 to 20 parts by weight compared to 100 parts by weight of a resin precursor.

More detailed explanation about the initiator for photopolymerization is as follows. Specifically, examples of the benzophenone type initiator for photopolymerization include benzophenone, benzoyl benzoic acid, 4-phenyl benzophenone, 4,4-diethylamino benzophenone, 3,3-dimethyl-4-methoxy benzophenone, 4-benzoyl-4-methyldiphenylsulfide and the like. Further, examples of the thioxanthone type initiator for photopolymerization include thioxanthone, 2-chlorooxanthone, 2,4-diethyl thioxanthone, 1-chloro-4-propoxy thioxanthone, isopropylxanthone and the like. Examples of the acetophenone type initiator for photopolymerization include 2-methyl-1-[(4-methylthio)phenyl]-2-morpholino-propan-1-one, 2-benzyl-2-dimethylamino-1-(4-morpholinophenyl)-butanone-1,1-[4-(2-hydroxyethoxy)-phenyl]-2-hydroxy-2-methyl-1-propan-1-one, 2-hydroxy-2-methyl-1-phenyl propan-1-one, 1-hydroxy-cyclohexyl-phenyl-ketone, 2,2-dimethyl-2-hydroxyacetophenone, 2,2-dimethoxy-2-phenylacetophenone, 4-phenoxydichloroacetophenone, diethoxyacetophenone, 1-hydroxycyclohexylphenyl ketone and the like. Examples of the benzoin type initiator for photopolymerization include benzoin methyl ether, benzoin isobutyl ether, benzylmethyl ketal and the like. Examples of the acylphosphine oxide type initiator for photopolymerization include 2,4,6-trimethylbenzoyldiphenyl phosphine oxide, bis(2,4,6-trimethylbenzoyl)acylphosphine oxide and the like. Examples of the bisimidazole type initiator for photopolymerization include 2,2'-bis(o-chlorophenyl)-4,5,4',5'-tetraphenyl-1,2'-biimidazole, 2,2'-bis(o-chlorophenyl)-4,5,4',5'-tetra(4-methylphenyl)-1,2'-biimidazole and the like. Examples of the acridine type initiator include 1,7-bis(9-acridyl)heptane. Examples of the carbazole-phenone type initiator include 3,6-bis(1-keto-2-methyl-2-morpholinopropyl)-9-octylcarbazole. Examples of the triazin type initiator include 2,4,6-trichloro-s-triazin, 2-phenyl-4,6-bis(trichloromethyl)-s-triazin, 2-(p-methoxyphenyl)-4,6-bis(trichloromethyl)-s-triazin, 2-(p-tolyl)-4,6-bis(trichloromethyl)-s-triazin, 2-piperonyl-4,6-bis(trichloromethyl)-s-triazin, 2,4-bis(trichloromethyl)-6-styryl-s-triazin, 2-(naphtho-1-yl)-4,6-bis(trichloromethyl)-s-triazin, 2-(4-methoxy-naphtho-1-yl)-4,6-bis(trichloromethyl)-s-triazin, 2,4-trichloromethyl-(piperonyl)-6-triazin, 2,4-trichloromethyl(4'-methoxystyryl)-6-triazin and the like. Further, the oxime type initiator and the like can be also used.

In a composition for forming an anion exchange layer including a resin precursor of the present invention, an accelerator for photopolymerization and a sensitizer may be also contained together with the initiator for photopolymerization. Examples of the accelerator for photopolymerization and the sensitizer include aliphathic or aromatic amines such as triethanolamine, triisopropanolamine, 4,4-dimethylaminobenzophenone, ethyl 2-dimethylaminobenzoate, (n-butoxy)ethyl 4-dimethylaminobenzoate and the like.

Further, in a composition for forming an anion exchange layer including a resin precursor, an inhibitor for (thermo)polymerization may be contained to increase the stability of the composition. Examples of the inhibitor for (thermo)polymerization include hydroquinone, hydroquinone monomethyl ether, p-benzoquinone, 2,6-t-butyl-p-cresol, 2,3-dimethyl-6-t-butylphenol, anthraquinone, phenothiazine, N-nitrosophenylhydroxylamine aluminate salt and the like.

Other resin and its precursor may be used in an addition amount of 0.01 to 99% by weight, preferably 0.1 to 95% by weight in 100% by weight of the composition for forming an anion exchange layer.

Meanwhile, organic or inorganic fine particles with or without anion exchange ability may be contained in a composition for forming an anion exchange layer of the present invention, if necessary. For example, by including organic fine particles and/or inorganic fine particles in the composition for forming a coating film described above, the material having anion exchange ability may be homogeneously distributed in an anion exchange layer so that an anion exchange reaction can occur more efficiently when the material having anion exchange ability is brought into contact with conductive fine particles.

Further, an average particle diameter of fine particles with or without anion exchange ability is preferably in the range of 0.001 to 20.0 μm. When fine particles having an average particle diameter of greater than 20.0 μm are used, it is undesirable in that not only expression of conductivity is reduced but also stability and physical properties of the composition for forming a coating film are impaired. The fine particles may be used in an addition amount of 1 to 99% by weight, preferably 5 to 95% by weight in 100% by weight of the composition for forming an anion exchange layer.

Examples of the above inorganic fine particles with or without anion exchange ability include clay, diatomite, aluminum silicate, calcium silicate, magnesium silicate, hydrotalcite, talc, kaolin, calcined kaoline, saponite, mordenite, barium sulfate, magnesium sulfate, iron sulfate (II), calcium sulfate, magnesium hydroxide, zinc oxide, zinc hydroxide, zinc sulfide, lead oxide, magnesium phosphate, aluminum chloride, synthetic amorphous silica, colloidal silica, aluminum hydroxide, lithopone, zeolite, montmorillonite and the like. Among these inorganic fine particles, amorphous silica and colloidal silica are preferred.

Meanwhile, examples of organic fine particles include natural products such as starch, and fine resin particles of acrylic resins such as polymethylmethacrylate, polystyrene resins, styrene/acryl resins, nylon resins such as Nylon 6, Nylon 12, and Nylon 6-12, olefin resins such as high density polyethylene, low density polyethylene, polypropylene, tetrafluoroethylene, polyester resins, phenol resins, or benzoguanamine resins. Theses fine particles may be used alone or in combination of two or more thereof.

(C-3) Composition for Forming Coating Film Containing Conductive Material Covered with Protective Material and Material Having Anion Exchange Ability A composition for forming a coating film containing a conductive material covered with a protective material and a material having anion exchange ability can be prepared by dispersing a conductive material covered with a protective material and a material having anion exchange ability, if necessary, with a liquid medium, an anti-foaming agent, a leveling agent, a lubricant, a dispersing agent, a resin and/or its precursor which does not have anion exchange ability, an inorganic or organic fine particles and the like with or without anion exchange ability according to a conventional method, i.e., with a method using a ball mill, an attriter, a sand mill, a jet mill, triple-roll mill, a paint shaker and the like, or by stirring and mixing them using a mixer or a dissolver. In this case, a liquid medium, an anti-foaming agent, a leveling agent, a lubricant, a dispersing agent, a resin and/or its precursor which does not have anion exchange ability, an inorganic or organic fine particles and the like with or without anion exchange ability and the like, that are used if necessary, are appropriately selected from those used for producing a composition for forming a coating film containing a conductive material covered with a protective material or a composition for forming a coating film containing a material having anion exchange ability, depending on a substrate to be coated by the composition, a method for coating or printing, desirable properties of a film after coating, and conductive properties and the like.

(D) Method for Producing Conductive Coating Film

Because the method for producing a conductive coating film according to the present invention is characterized in that a conductive material covered with a protective material is brought into contact with a material having anion exchange ability, there is no specific limitation in a method for producing a conductive coating film, a type of a substrate, a shape of a conductive coating film, etc. as long as the contact can be successfully made. As an aspect for bringing a conductive material covered with a protective material into contact with a material having anion exchange ability, there are (I) a layer containing a conductive material covered with a protective material and a layer containing a material having anion exchange ability are formed as a neighboring layer, and (II) a conductive material covered with a protective material and a material having anion exchange ability are contained in a state in which they are brought into contact with each other in the same layer. In addition, with respect to the aspect (I) above, there are a process (I-1) wherein an anion exchange layer containing a material having anion exchange ability is formed on a substrate and then a coating film layer containing a conductive material covered with a protective material is formed on the anion exchange layer to give a conductive coating film, and a process (I-2) wherein a coating film layer containing a conductive material covered with a protective material is formed on a substrate and then an anion exchange layer containing a material having anion exchange ability is formed on the coating film layer containing a conductive material to give a conductive coating film, as it has been described before. According to the present invention, any of the above methods can be used to form a conductive coating film at low temperature in short time. In addition, an appropriate aspect for achieving the contact can be chosen depending on a type of a substrate, coating form, materials to be used, usage of an obtained film, conductive properties required for a conductive coating film, etc. Further, it is evident that the method for producing a conductive coating film of the present invention is not limited to those described above, as it has been described above.

As a substrate for forming a conductive coating film, any material that is generally known to be used as a substrate can be employed and it includes paper, plastic film, glass, cloth and the like. The substrate is not necessarily to be in a form of a film or a sheet. In addition, a substrate on which a coating film is formed can be also used as a substrate. Depending on the usage, a substrate can be appropriately selected and used among the conventionally known substrates. Hereinafter, more detailed explanation is given with respect to a substrate. As a paper substrate, a processed paper such as a synthetic paper, a polyethylene coated paper, an impregnated paper, a water-resistant paper, an insulating paper, a stretch-processed paper and the like may be used in addition to a coated paper and a non-coated paper. Among them, for obtaining stable conductivity of a conductive coating film, a coated paper and a processed paper are preferred. The coated paper is preferred because the higher smoothness is, the higher stabilization of resistance of a conductive coating film is obtained.

As the plastic substrate, a substrate consisting of general plastics such as polyester, polyethylene, polypropylene, cellophane, vinyl chloride, vinylidene chloride, polystyrene, polyvinyl alcohol, ethylene/vinylalcohol copolymer, nylon, polyimide, polycarbonate and the like can be used. A corona discharge treatment, a plasma treatment or application of a coating agent containing a resin such as polyurethane, polyisocyanate, organic titanate, polyethyleneimine, polybutadiene or the like may be carried out on a surface of the plastic film in order to increase the adhesiveness of the conductive coating film formed thereon or to improve printing reproducibility of a conductive coating film or a conductive circuit, if necessary.

As a glass substrate, any kind of glasses that are generally used as a substrate glass can be used. Examples include soda lime glass, micro sheet glass, alkali-free glass, Pyrex glass, Vycor glass, quartz glass and the like.

As a cloth substrate, a plant cloth such as cotton, linen and the like, an animal cloth such as silk, wool and the like, a chemical cloth such as polyester, acryl, nylon, vinylon, polypropylene, polyvinyl chloride, polyethylene, polyvinylidene chloride, polyurethane and the like, and regenerated cloth such as rayon, polynosic, cupra and the like can be mentioned. Further, as a cloth, any of fabrics, knit, non-woven fabrics and the like can be used, for example.

According to the present invention, coating may be carried out by any means including general printing methods such as gravure printing, flexography, screen printing, ink-jet printing and the like, and coating with a coater, impregnation, spray, and the like. In addition, forms of the coating or the printing may be a planar form or a figure form such as a circuit, etc.

With respect to the method for producing a conductive coating film of the present invention, the above process (I-1) will be more specifically explained first.

Firstly, with a publicly known method, the composition for forming an anion exchange layer of the present invention is coated or printed on a substrate. Method of coating or printing may be appropriately selected in view of the type of a substrate and the use. That is, publicly known methods such as gravure printing, flexography, ink-jet printing, dispenser printing, spray coating, spin coating, die coating, lip coating, knife coating, dip coating, curtain coating, roll coating, bar coating and the like can be used. Consequently, drying is carried out at drying temperature of approximately 50 to 150° C. for several seconds to several tens of minutes depending on the type of a substrate to form an anion exchange film on the substrate. Thickness of the anion exchange layer is not specifically limited, but it is generally within the range of 0.1 to 200 μm, preferably in the range of 1 to 100 μm.

Next, the composition for forming a coating film layer containing a conductive material covered with a protective material of the present invention is either coated or printed on top of the above anion exchange layer. With respect to a method of coating or printing, gravure printing, flexography, ink-jet printing, spray coating, spin coating, die coating, lip coating, knife coating, dip coating, curtain coating, roll coating, bar coating and the like can be used. After the coating or the printing, drying is carried out at drying temperature of approximately 50 to 150° C. for several seconds to several tens of minutes depending on the type of a substrate to be used to obtain a conductive coating film having low resistance, for example a conductive circuit, a conductive layer or the like. Although a conductive coating film may also be obtained by leaving and removing a solvent with drying at room temperature of 25° C. for several hours or drying under vacuum, drying at the above range of temperature is preferred to obtain sufficient conductivity. As a drying method, any method including hot air drying, far infrared drying and the like may be used. For a situation in which heat cannot be applied, for example when a shrink film and the like is used as a substrate, an ion exchange coating material film is formed on a coating film layer containing a conductive material, and then heated, for example overnight at 40° C. in an oven, to obtain sufficient conductivity. Thickness of the coating film containing a conductive material (i.e., thickness of a conductive coating film) is not specifically limited, but it is generally within the range of 0.01 to 20 μm, preferably in the range of 0.05 to 10 μm. For example, when a conductive coating film is used as an electronic wave shield coating film, the thickness will be in the range of 0.05 to 5 μm. In addition, when a conductive coating film is used as a conductive circuit, the thickness will be in the range of 0.5 to 20 μm.

Drying of a coating film can be carried out according to any method including hot air drying, far infrared drying and the like.

According to the method described in the above, a conductive coating film having excellent conductivity and adhesiveness to a substrate can be obtained.

With respect to the method (I-2) for producing a conductive coating film, coating or printing order of a composition for forming a coating film layer containing a conductive material covered with a protective material and a composition for forming an anion exchange layer can be simply reversed compared to that of method (I-1). Specifically, a composition for forming a coating film layer containing a conductive material is coated or printed on a substrate in the same manner as method (I-1), and dried to form a film, a circuit and the like containing a conductive material. Next, a composition for forming an anion exchange layer is coated or printed thereto in the same manner as method (I-1), and dried to form an anion exchange layer. As a result, a conductive coating film having excellent conductivity and adhesiveness to a substrate can be obtained, same as the method (I-1) described in the above. Furthermore, when an anion exchange layer is formed on a coating film containing a conductive material, it is also possible that the anion exchange layer is formed as a layer with function of a protective layer for the conductive coating film layer.

With respect to the method (II) for producing a conductive coating film, a composition for forming a coating film containing a conductive material covered with a protective material and a material having anion exchange ability, that are obtained in the above, are coated or printed on a substrate according to a publicly known method as described above, and then dried to yield a conductive coating film.

Furthermore, according to the present invention, when a coating film is formed on a substrate, it is not necessary that the film covers entire surface of a substrate. Rather, it can cover a part of the surface or be in a pattern shape or a circuit.

The conductive coating film that is produced by the method of the present invention, e.g., a conductive circuit and the like, can be subjected to a heat treatment or a heat and press treatment to promote fusion and metallization of the conductive coating film layer, thus further lowering a resistance. The heat and press treatment is preferable in order to obtain higher conductivity. However, any one of the treatment methods may be selected depending on the type of a substrate to be used. The heat and press treatment may be carried out using a press roll machine, a press machine, a laminator and the like. Conditions for the heat treatment or the heat and press treatment can be selected within the limit in which the substrate is not affected. It is preferable that the treatment temperature is in the range of 50 to 150° C., the pressure is in the range of 0.5 to 2.0 MPa, the pressurizing time is in the range of 10 sec to 10 min. When a press roll machine is used, nip pressure of the roll is preferably in the range of 1 to 25 kg/cm. Further, the conveying speed of a substrate for press treatment may be in the range of 1 to 30 m/min.

Further, after forming a conductive film such as a conductive circuit and the like, an over print varnish, and other various coating agents and the like may be further coated thereto for protection. For such various varnish and coating agent, those conventionally used in a printing field can be used, and any of general heat-drying type and activate energy ray-curable type can be used as the varnish or coating agent.

Still further, after applying an adhesive on a conductive coating film, a paper substrate or a plastic film may be laminated thereto by adhesion of the substrate or film or melt-extrusion of a plastic, etc. to protect a circuit or a coating film. It is also evident that a protective layer can be formed by use of a substrate on which adhesive or an adhesive agent has been previously coated for adhesion.

(E) A Laminate Having Coating Film which Contains Conductive Material

As described in the above, according to the present invention, a laminate having a coating film which contains a conductive material is produced by forming a coating film containing a conductive material on a substrate. Specific aspects of the laminate may vary depending on a type of a substrate to be used, an order of forming a coating film containing a conductive material and an anion exchange layer, the presence of further protective layer, and the use, etc. Representative forms of the laminate of the present invention include a laminate wherein on a substrate to which a layer for improving adhesiveness has been formed or a pretreatment such as a UV treatment, a corona discharge treatment, a plasma treatment and the like has been carried out if necessary, an anion exchange film layer, a coating film layer containing a conductive material, and a protective layer, that is formed if necessary, are sequentially formed, and a laminate wherein the anion exchange film layer and coating film layer containing a conductive material are laminated in a reverse order. In addition, between the protective layer and the coating film layer containing a conductive material or the anion exchange film layer, both as an underlayer, a functional layer such as an adhesive layer and the like can be formed.

(F) Various Use of Conductive Coating Film

As the conductive coating film of the present invention can be formed at low temperature and has excellent adhesiveness to various substrates, it can be formed on any substrate which has been known as a substrate until now. In addition, because a conductive coating film with excellent properties can be formed at low temperature in short time and it can be produced so as to have any film thickness, i.e., from thin layer to thick layer, it can be applied to a conductive film, a conductive circuit and the like with uses in various fields in which a conventional conductive film has been used. Among them, a use for which the conductive coating film of the present invention is preferably used is, for example, an antenna circuit of non-contact type IC media, a conductive circuit on a printing board, a conductive material for print electronics, various types of electrode materials, for forming a mesh to shield an electromagnetic wave, a conductive thin film for shielding an electromagnetic wave, an anti-static film, and a film for providing conductivity to a non-conductive material, for example an electroconductive cloth and the like. In addition, in view of the fact that the conductive coating film of the present invention can provide volume resistance of the order of $10^6$ Ω·cm with relatively thin layer thickness of around 0.1 to 5 μm, it can be preferably used for a conductive film for an antenna circuit of non-contact type IC media and the like.

EXAMPLES

Hereinafter, the present invention will be described more in detail with reference to the examples, but it should be understood that the present invention is not limited thereto. In the examples, "part" means "part by weight", and "%" means "% by weight."

Synthetic Example 1 for Preparing Conductive Fine Particle

To a 4-neck separable flask, a condenser, a thermometer, a tube for introducing nitrogen gas and a stirrer were attached. Under nitrogen atmosphere, 200 parts of toluene and 38.9 parts of silver oleate were added to the flask at room temperature under stirring to obtain 0.5 M silver oleate solution. Then, 2.3 parts of diethylamino ethanol (i.e., 0.2 mol compared to 1 mol metal) as a dispersing agent were added and dissolved. Upon adding dropwise 73.1 parts of a 20% aqueous solution of succinic acid dihydrazide (herein after, abbreviated as SUDH; 2 mol of hydrazide group compared to 1 mol metal), color of the solution was changed from light yellow to dark brown. To further facilitate the reaction, the temperature was raised to 40° C. and the reaction was allowed to proceed. After maintaining for a while to separate aqueous solution and toluene, the aqueous layer was drawn out from the flask to remove excess reducing agent or impurities. Washing of the toluene layer by adding distilled water to the remaining toluene layer and separation of the distilled water were repeated several times to obtain a toluene dispersion solution including silver fine particles. With respect to thus-obtained dispersion of silver fine particles, the average particle diameter of the silver fine particles was 7±2 nm and the silver concentration was 73%. Further, the average particle diameter of the silver fine particles was unchanged even after the storage at 40° C. for one month.

Synthetic Example 2 for Preparing Conductive Fine Particle

To a 4-neck separable flask, a condenser, a thermometer, a tube for introducing nitrogen gas and a stirrer were attached. Under nitrogen atmosphere, 200 parts of toluene and 18.1 parts of silver propionate were added to the flask at room temperature under stirring to obtain 0.5 M silver propionate solution. Then, 2.3 parts of diethylamino ethanol (i.e., 0.2 mol compared to 1 mol metal) and 2.8 parts of oleic acid (0.1 mol compared to 1 mol metal) as a dispersing agent were added and dissolved. Upon adding dropwise 73.1 parts of a 20% aqueous SUDH solution (2 mol of hydrazide group compared to 1 mol metal), color of the solution was changed from light yellow to dark brown. To further facilitate the reaction, the temperature was raised to 40° C. and the reaction was allowed to proceed. After maintaining for a while to separate aqueous solution and toluene, the aqueous layer was drawn out from the flask to remove excess reducing agent or impurities. Washing of the toluene layer by adding distilled water to the remaining toluene layer and separation of the distilled water were repeated several times to obtain a toluene dispersion solution including silver fine particles. With respect to thus-obtained dispersion of silver fine particles, the average particle diameter of the silver fine particles was 5±2 nm and the silver concentration was 75%. Further, the average particle diameter of the silver fine particles was unchanged even after the storage at 40° C. for one month.

Synthetic Example 3 for Preparing Conductive Fine Particles

Dispersion of silver fine particles was obtained in the same manner as Synthetic example 2 except that the metal salt as a reacting material was changed to 20.9 parts of silver pentanoate. With respect to thus-obtained dispersion of silver fine particles, the average particle diameter of the silver fine particles was 5±1 nm and the silver concentration was 82%. Further, the average particle diameter of the silver fine particles was unchanged even after the storage at 40° C. for one month.

Synthetic Example 4 for Preparing Conductive Fine Particles

Dispersion of silver fine particles was obtained in the same manner as Synthetic example 2 except that the metal salt as a reacting material was changed to 22.3 parts of silver hexanoate. With respect to thus-obtained dispersion of silver fine particles, the average particle diameter of the silver fine particles was 5±2 nm and the silver concentration was 80%. Further, the average particle diameter of the silver fine particles was unchanged even after the storage at 40° C. for one month.

Synthetic Example 5 for Preparing Conductive Fine Particle

Dispersion of silver fine particles was obtained in the same manner as Synthetic example 2 except that the metal salt as a reacting material was changed to 25.1 parts of silver octanoate. With respect to thus-obtained dispersion of silver fine particles, the average particle diameter of the silver fine particles was 6±2 nm and the silver concentration was 70%. Further, the average particle diameter of the silver fine particles was unchanged even after the storage at 40° C. for one month.

Synthetic Example 6 for Preparing Conductive Fine Particle

Dispersion of silver fine particles was obtained in the same manner as Synthetic example 2 except that the metal salt as a reacting material was changed to 33.5 parts of silver myristate. With respect to thus-obtained dispersion of silver fine particles, the average particle diameter of the silver fine particles was 8±2 nm and the silver concentration was 72%. Further, the average particle diameter of the silver fine particles was unchanged even after the storage at 40° C. for one month.

Synthetic Example 7 for Preparing Conductive Fine Particle

Dispersion of silver fine particles was obtained in the same manner as Synthetic example 2 except that the metal salt as a reacting material was changed to 39.1 parts of silver stearate. With respect to thus-obtained dispersion of silver fine particles, the average particle diameter of the silver fine particles was 8±2 nm and the silver concentration was 65%. Further, the average particle diameter of the silver fine particles was unchanged even after the storage at 40° C. for one month.

Synthetic Example 8 for Preparing Conductive Fine Particle

Dispersion of silver fine particles was obtained in the same manner as Synthetic example 2 except that the metal salt as a reacting material was changed to 19.5 parts of silver butanoate. With respect to thus-obtained dispersion of silver fine particles, the average particle diameter of the silver fine particles was 5±2 nm and the silver concentration was 75%. Further, the average particle diameter of the silver fine particles was unchanged even after the storage at 40° C. for one month.

Synthetic Example 9 for Preparing Conductive Fine Particle

To a 4-neck separable flask, a condenser, a thermometer, a tube for introducing nitrogen gas and a stirrer were attached. Under nitrogen atmosphere, 200 parts of toluene and 18.1 parts of silver propionate were added to the flask at room temperature under stirring to obtain 0.5 M silver propionate solution. Then, 2.3 parts of diethylamino ethanol (i.e., 0.2 mol compared to 1 mol metal) and 20% toluene solution including 1.1 parts of Ajisper PB821 (manufactured by Ajinomoto Fine-Techno, Inc.; 10% by weight compared to metal) as a dispersing agent were added and dissolved. Upon adding dropwise 73.1 parts of a 20% SUDH aqueous solution (i.e., 2 mol of hydrazide group compared to 1 mol metal), color of the solution was changed from light yellow to dark brown. To further facilitate the reaction, the temperature was raised to 40° C. and the reaction was allowed to proceed. After maintaining for a while to separate aqueous solution and toluene, the aqueous layer was drawn out from the flask to remove excess reducing agent or impurities. By adding distilled water to the remaining toluene layer, washing of the toluene layer and separation of the distilled water were repeated several times to obtain a toluene dispersion solution including silver fine particles. With respect to thus-obtained dispersion of silver fine particles, the average particle diameter of the silver fine particles was 5±2 nm and the silver concentration was 68%. Further, the average particle diameter of the silver fine particles was unchanged even after the storage at 40° C. for one month.

Synthetic Example 10 for Preparing Conductive Fine Particle

To a 4-neck separable flask, a condenser, a thermometer, a tube for introducing nitrogen gas and a stirrer were attached. Under nitrogen atmosphere, 200 parts of toluene and 20.9 parts of silver pentanoate were added to the flask at room temperature under stirring to obtain 0.5 M silver pentanoate solution. Then, 2.3 parts of diethylamino ethanol (i.e., 0.2 mol compared to 1 mol metal) and 20% toluene solution obtained by dilution of 2.2 parts of Disparlon PW36 (solid content 50%, manufactured by Kusumoto Chemicals, Ltd.; 10% by weight compared to metal) as a dispersing agent were added and dissolved. Upon adding dropwise 73.1 parts of a 20% SUDH aqueous solution (i.e., 2 mol of hydrazide group compared to 1 mol metal), color of the solution was changed from light yellow to dark brown. To further facilitate the reaction, the temperature was raised to 40° C. and the reaction was allowed to proceed. After maintaining for a while to separate aqueous solution and toluene, the aqueous layer was drawn out from the flask to remove excess reducing agent or impurities. By adding distilled water to the remaining toluene layer, washing of the toluene layer and separation of the distilled water were repeated several times to obtain a toluene dispersion solution including silver fine particles. With respect to thus-obtained dispersion of silver fine particles, the average particle diameter of the silver fine particles was 6±2 nm and the silver concentration was 80%. Further, the average particle diameter of the silver fine particles was unchanged even after the storage at 40° C. for one month.

Synthetic Example 11 for Preparing Conductive Fine Particle

To a 4-neck separable flask, a condenser, a thermometer, a tube for introducing nitrogen gas and a stirrer were attached. Under nitrogen atmosphere, 200 parts of toluene and 22.3 parts of silver hexanoate were added to the flask at room temperature under stirring to obtain 0.5 M silver hexanoate solution. Then, 2.3 parts of diethylamino ethanol (i.e., 0.2 mol compared to 1 mol metal) and 20% toluene solution obtained by dilution of 2.2 parts of EFKA5010 (solid content 50%, manufactured by EFKA ADDITIVES: 10% by weight compared to metal) as a dispersing agent were added and dissolved. Upon adding 73.1 parts of a 20% SUDH aqueous solution (i.e., 2 mol of hydrazide group compared to 1 mol metal), color of the solution was changed from light yellow to dark brown. To further facilitate the reaction, the temperature was raised to 40° C. and the reaction was allowed to proceed. After maintaining for a while to separate aqueous solution and toluene, the aqueous layer was drawn out from the flask to remove excess reducing agent or impurities. Washing of the toluene layer by adding distilled water to the remaining toluene layer and separation of the distilled water were repeated several times to obtain a toluene dispersion solution including silver fine particles. With respect to thus-obtained dispersion of silver fine particles, the average particle diameter of the silver fine particles was 5±2 nm and the silver concentration was 82%. Further, the average particle diameter of the silver fine particles was unchanged even after the storage at 40° C. for one month.

Synthetic Example 12 for Preparing Conductive Fine Particle

To a 4-neck separable flask, a condenser, a thermometer, a tube for introducing nitrogen gas and a stirrer were attached. Under nitrogen atmosphere, 100 parts of an 1M silver nitrate aqueous solution was added and a solution obtained by dissolving 1.9 parts of Solsperse 32000 (manufactured by Lubrizol Japan Ltd., weight average molecular weight of about 50,000) in 10.8 parts of toluene was added dropwise thereto.

After stirring the mixture at room temperature for 30 minutes, 38.1 parts of dimethylamino ethanol were added dropwise and the reaction was allowed to proceed under stirring overnight at room temperature. The aqueous layer was drawn out from the flask, and then washing using distilled water and separation thereof were repeated several times to remove excess reducing agent and impurities, yielding a dispersion of silver fine particles. Thus-obtained dispersion of silver fine particles was in a paste form, the average particle diameter of the silver fine particles was 25±10 nm, and the silver concentration was 50%.

Example 1

60 parts of a cationic resin (Saftomer ST-3000, manufactured by Mitsubishi Chemical Co., Ltd; solid content 25%) as a material having anion exchange ability and 40 parts of a liquid medium (water/isopropyl alcohol=1/1, weight ratio) were mixed followed by stirring for 20 minutes with a dissolver to obtain a coating which contains a material having anion exchange ability. Next, this coating having anion exchange ability was applied on a polyester film (Ester E5100, manufactured by TOYOBO Co., Ltd.; 100 μm thickness) by a bar coater followed by drying for 5 minutes at 75° C. to obtain an anion exchange layer having coating film thickness of 6 μm after drying.

Thereafter, the dispersion of silver fine particles described in above Synthetic example 1 for preparing conductive fine particles was printed on the above anion exchange layer according to a dispenser method to form a circuit pattern of 3 mm in width, followed by drying it for 10 minutes in a hot air oven at 120° C. to obtain a conductive coating film.

Example 2

7.5 parts of polyvinyl alcohol resin (Poval PVA-117, manufactured by Kuraray Co., Ltd.) as the other resin, 2.5 parts of a quaternary ammonium salt (Quartamin 24P, manufactured by Kao Corporation) as a material having anion exchange ability and 90 parts of a liquid medium (water/isopropyl alcohol=1/1) were mixed followed by stirring it for 60 minutes by a dissolver to obtain a coating which contains a material having anion exchange ability. Next, this coating having anion exchange ability was applied on a glass plate according to a spin coating method followed by drying it for 5 minutes at 75° C. to obtain an anion exchange layer having a coating film thickness of 6 μm after drying.

Thereafter, the dispersion of silver fine particles described in above Synthetic example 2 for preparing conductive fine particles was applied on the above anion exchange layer according to a spin coating method, followed by drying it for 10 minutes in a hot air oven at 150° C. to obtain a conductive coating film.

Example 3

15 parts of a cationic resin (Pulset JK-510, manufactured by Meisei Chemical Works, Ltd.; solid content 20%) as a material having anion exchange ability, 60 parts of colloidal silica (Snowtex O, manufactured by Nissan Chemical Industries, Ltd.; solid content 20%) as a material having no anion exchange ability, and 25 parts of a liquid medium (water/isopropyl alcohol=1/1) were mixed followed by stirring it for 20 minutes by a dissolver to obtain printing ink which contains a material having anion exchange ability. Next, this printing ink having anion exchange ability was solid printed on an entire surface of a polyester film (Ester E5100, manufactured by TOYOBO Co., Ltd.; 100 μm thickness) by a small gravure printer, followed by drying it to obtain an anion exchange layer having a coating film thickness of 5 μm. The drying temperature of the printer was set at 60° C.

Thereafter, the gravure printing was conducted on the above anion exchange layer by a small gravure printer with the dispersion of silver fine particles described in above Synthetic example 3 for preparing conductive fine particles to form a conductive circuit pattern of 3 mm in width, followed by drying it to obtain a conductive coating film. The drying temperature of the printer was set at 100° C. as a measured value.

Example 4

15 parts of a cationic resin (Pulset JK-510, manufactured by Meisei Chemical Works, Ltd.; solid content 20%) as a material having anion exchange ability, 60 parts of colloidal silica (Snowtex O, manufactured by Nissan Chemical Industries, Ltd.; solid content 20%) as a material having no anion exchange ability, and 25 parts of a liquid medium (water/isopropyl alcohol=1/1) were mixed followed by stirring it for 20 minutes by a dissolver to obtain printing ink which contains a material having anion exchange ability. Next, this printing ink having anion exchange ability was solid printed on an entire surface of a polyester film (Ester E5100, manufactured by TOYOBO Co., Ltd.; 100 μm thickness) by a small gravure printer followed by drying it to obtain an anion exchange layer having a coating film thickness of 5 μm after drying. The drying temperature of the printer was set at 60° C.

Next, to 100 parts of the dispersion of silver fine particles described in above Synthetic example 3 for preparing conductive fine particles, 5 parts of polyester resin (Elitel UE-3220, manufactured by UNITIKA Ltd.; 4.3% by weight in 100 parts of conductive ink) as the other resin and 10 parts of a liquid medium (methyl ethyl ketone) were added followed by stirring it for 30 minutes by a dissolver to obtain conductive printing ink. Thereafter, this conductive ink was printed on the above anion exchange layer by a small gravure printer to form a conductive circuit pattern of 3 mm in width, followed by drying it to obtain a conductive coating film. The drying temperature of the printer was set at 100° C. as a measured value.

Example 5

15 parts of a cationic resin (Pulset JK-510, manufactured by Meisei Chemical Works, Ltd.; solid content 20%) as a material having anion exchange ability, 60 parts of colloidal silica (Snowtex O, manufactured by Nissan Chemical Industries, Ltd.; solid content 20%) as a material having no anion exchange ability, and 25 parts of a liquid medium (water/isopropyl alcohol=1/1) were mixed followed by stirring it for 20 minutes by a dissolver to obtain printing ink which contains a material having anion exchange ability. Next, this printing ink having anion exchange ability was solid printed on an entire surface of a polyester film (Ester E5100, manufactured by TOYOBO Co., Ltd.; 100 μm thickness) by a small gravure printer followed by drying it to obtain an anion exchange layer having a coating film thickness of 5 μm. The drying temperature of the printer was set at 60° C.

Next, to 100 parts of the dispersion of silver fine particles described in above Synthetic example 3 for preparing conductive fine particles, 0.5 parts of a leveling agent (BYK-051, manufactured by BYK-Chemie Japan; solid content 20%) as other additives (i.e., 0.1% by weight in 100 parts of conductive ink) were added followed by stirring it for 10 minutes by a dissolver to obtain conductive ink. Thereafter, this conductive ink was printed on the above anion exchange layer by a small gravure printer to form a conductive circuit pattern of 3 mm in width, followed by drying it to obtain a conductive coating film. The drying temperature of the printer was set at 100° C. as a measured value.

Example 6

15 parts of polyacetal resin (S-LEC KW-1, manufactured by SEKISUI CHEMICAL Co., Ltd.; solid content 20%) as the other resin, 60 parts of colloidal silica (Snowtex AK, manufactured by Nissan Chemical Industries, Ltd.; solid content 20%) as a material having anion exchange ability, and 25 parts of a liquid medium (water/diethylene glycol monoethyl ether acetate=4/6) were mixed followed by stirring it for 20 minutes by a dissolver to obtain ink for an ink-jet printer which contains a material having anion exchange ability. Next, this ink having anion exchange ability was printed on a polyester film (Ester E5100, manufactured by TOYOBO Co., Ltd.; 100 µm thickness) according to an ink-jet printing method followed by drying it for 10 minutes in a hot air oven at 100° C. to obtain an anion exchange layer having coating film thickness of 5 µm.

Thereafter, the dispersion of silver fine particles described in above Synthetic example 3 for preparing conductive fine particles was printed on the above anion exchange layer according to an ink-jet printing method to form a conductive circuit pattern of 3 mm in width, followed by drying it for 10 minutes in a hot air oven at 150° C. to obtain a conductive coating film.

Example 7

A conductive coating film was obtained in the same manner as Example 6 except that the dispersion of Synthetic example 1 for preparing conductive fine particles was used as a dispersion of silver fine particles.

Example 8

A conductive coating film was obtained in the same manner as Example 6 except that the dispersion of Synthetic example 2 for preparing conductive fine particles was used as a dispersion of silver fine particles.

Example 9

A conductive coating film was obtained in the same manner as Example 6 except that the dispersion of Synthetic example 4 for preparing conductive fine particles was used as a dispersion of silver fine particles.

Example 10

5 parts of a cationic resin (PAPIOGENE P-105, manufactured by SENKA Corporation; solid content 60%) as a material having anion exchange ability, 20 parts of colloidal silica (Snowtex O, manufactured by Nissan Chemical Industries, Ltd.; solid content 20%) as a material having no anion exchange ability, 40 parts of cationic colloidal silica (Snowtex AK, manufactured by Nissan Chemical Industries, Ltd.; solid content 20%) as a material having anion exchange ability, and 35 parts of a liquid medium (water/isopropyl alcohol=1/1) were mixed followed by stirring it for 20 minutes by a dissolver to obtain printing ink which contains a material having anion exchange ability. Next, this ink having anion exchange ability was solid printed on an entire surface of a polyester film (Ester E5100, manufactured by TOYOBO Co., Ltd.; 100 µm thickness) by a CI type flexographic printer (SOLOFLEX, manufactured by W & H, anilox 100 lines/inch) followed by drying it to obtain an anion exchange layer having coating film thickness of 5 µm after drying. The drying temperature was set at 70° C. as a measured value.

Thereafter, the dispersion of silver fine particles described in above Synthetic example 3 for preparing conductive fine particles was printed on the above anion exchange layer by a flexographic printer to form a conductive circuit pattern of 3 mm in width, thus obtaining a conductive coating film. The drying temperature of the printer was set at 100° C. as a measured value.

Example 11

A conductive coating film was obtained in the same manner as Example 10 except that the drying temperature of the flexographic printer at a time of conductive ink printing was set at 50° C.

Example 12

15 parts of a cationic resin (Pulset JK-510, manufactured by Meisei Chemical Works, Ltd.; solid content 20%) as a material having anion exchange ability, 60 parts of colloidal silica (Snowtex O, manufactured by Nissan Chemical Industries, Ltd.; solid content 20%) as a material having no anion exchange ability, and 25 parts of a liquid medium (water/isopropyl alcohol=1/1) were mixed followed by stirring it for 20 minutes by a dissolver to obtain printing ink which contains a material having anion exchange ability. Next, this printing ink having anion exchange ability was solid printed on an entire surface of a polyester cloth by a small gravure printer followed by drying to obtain an anion exchange layer. The drying temperature of the printer was set at 60° C.

Thereafter, the dispersion of silver fine particles described in above Synthetic example 3 for preparing conductive fine particles was solid printed on the entire surface of the above anion exchange layer by a small gravure printer, followed by drying it to obtain a conductive coating film. The drying temperature of the printer was set at 100° C. as a measured value.

Example 13

A conductive coating film was obtained in the same manner as Example 3 except that the dispersion of Synthetic example 5 for preparing conductive fine particles was used as a dispersion of silver fine particles.

Example 14

A conductive coating film was obtained in the same manner as Example 3 except that the dispersion of Synthetic example 6 for preparing conductive fine particles was used as a dispersion of silver fine particles.

Example 15

A conductive coating film was obtained in the same manner as Example 3 except that the dispersion of Synthetic example 7 for preparing conductive fine particles was used as a dispersion of silver fine particles.

Example 16

A conductive coating film was obtained in the same manner as Example 3 except that the dispersion of Synthetic example 8 for preparing conductive fine particles was used as a dispersion of silver fine particles.

Example 17

A conductive coating film was obtained in the same manner as Example 3 except that the dispersion of Synthetic example 9 for preparing conductive fine particles was used as a dispersion of silver fine particles.

Example 18

15 parts of polyacetal resin (S-LEC KW-1, manufactured by SEKISUI CHEMICAL Co., Ltd.; solid content 20%) as the other resin, 60 parts of colloidal silica (Snowtex AK, manufactured by Nissan Chemical Industries, Ltd.; solid content 20%) as a material having anion exchange ability, and 25 parts of a liquid medium (water/diethylene glycol monoethyl ether acetate=4/6) were mixed followed by stirring it for 20 minutes by a dissolver to obtain ink for an ink-jet printer which contains a material having anion exchange ability. Next, this ink having anion exchange ability was printed on a polyester film (Ester E5100, manufactured by TOYOBO Co., Ltd.; 100 μm thickness) according to a ink-jet printing method followed by drying it for 10 minutes in a hot air oven at 100° C. to obtain an anion exchange layer having a coating film thickness of 5 μm.

Thereafter, the dispersion of silver fine particles described in above Synthetic example 10 for preparing conductive fine particles was printed on the above anion exchange layer according to an ink-jet method to form a conductive circuit pattern of 3 mm in width, followed by drying it for 10 minutes in a hot air oven at 150° C. to obtain a conductive coating film.

Example 19

A conductive coating film was obtained in the same manner as Example 18 except that the dispersion of Synthetic example 11 for preparing conductive fine particles was used as a dispersion of silver fine particles.

Example 20

A conductive coating film was obtained in the same manner as Example 3 except that the dispersion of Synthetic example 12 for preparing conductive fine particles was used as a dispersion of silver fine particles.

Example 21

A conductive coating film was obtained in the same manner as Example 18 except that the dispersion of Synthetic example 12 for preparing conductive fine particle was used as a dispersion of silver fine particles.

Example 22

A conductive coating film was obtained in the same manner as Example 1 except that the dispersion of Synthetic example 12 for preparing conductive fine particles was used as a dispersion of silver fine particles.

Example 23

49.5 parts of a flaky silver powder of which surface is treated with oleic acid (average particle diameter, 4.0 μm) as a conductive material, 36 parts of a cationic resin (Saftomer ST-3000, manufactured by Mitsubishi Chemical Co., Ltd; solid content 25%) as a material having anion exchange ability, 5 parts of polyacetal resin (S-LEC KW-1, manufactured by SEKISUI CHEMICAL Co., Ltd.; solid content 20%) as the other resin, and 9.5 parts of a liquid medium (diethylene glycol monobuthyl ether acetate) were mixed followed by stirring it for 30 minutes by a planetary mixer to obtain printing ink which contains a material having anion exchange ability.

Next, this ink was printed on a polyester film (Ester E5100, manufactured by TOYOBO Co., Ltd.; 100 μm thickness) according to a screen printing method to form a conductive circuit pattern of 3 mm in width, followed by drying it for 10 minutes in a hot air oven at 100° C. to obtain a conductive coating film.

Example 24

The dispersion of silver fine particles described in Synthetic example 1 for preparing conductive fine particles as a conductive material was applied on a polyester film (Ester E5100, manufactured by TOYOBO Co., Ltd.; 100 μm thickness) according to a dispenser method to print a circuit pattern of 3 mm in width, followed by drying for 10 minutes in a hot air oven at 100° C. to obtain a coating film layer containing a conductive material.

Next, 60 parts of a cationic resin (Saftomer ST-3000, manufactured by Mitsubishi Chemical Co., Ltd; solid content 25%) as a material having anion exchange ability and 40 parts of a liquid medium (water/isopropyl alcohol=1/1) were mixed followed by stirring for 20 minutes by a dissolver to obtain a coating which contains a material having anion exchange ability. Thereafter, this coating having anion exchange ability was applied on the above coating film layer by a bar coater followed by drying it for 5 minutes at 70° C. to obtain a conductive coating film.

Example 25

The dispersion of silver fine particles described in Synthetic example 2 for preparing conductive fine particles as a conductive material was applied on a glass plate according to a spin coating method, followed by drying it for 10 minutes in a hot air oven at 100° C. to obtain a coating film layer containing a conductive material.

Next, 7.5 parts of polyvinyl alcohol resin (Poval PVA-117, manufactured by Kuraray Co., Ltd.) as the other resin, 2.5 parts of a quaternary ammonium salt (Quartamin 24P, manufactured by Kao Corporation) as a material having anion exchange ability and 90 parts of a liquid medium (water/isopropyl alcohol=1/1) were mixed followed by stirring it for 60 minutes by a dissolver to obtain a coating which contains a material having ion exchange ability. Thereafter, this coating having ion exchange ability was applied on the above coating film layer according to a spin coating method followed by drying it for 5 minutes at 100° C. to obtain a conductive coating film.

Example 26

The dispersion of silver fine particles described in Synthetic example 3 for preparing conductive fine particles as a conductive material was printed on a polyester film (Ester E5100, manufactured by TOYOBO Co., Ltd.; 100 μm thickness) by a small gravure printer to form a conductive circuit pattern of 3 mm in width, followed by drying it to obtain a coating film layer containing a conductive material. The drying temperature of the printer was set at 90° C. as a measured value.

Next, 15 parts of a cationic resin (Pulset JK-510, manufactured by Meisei Chemical Works, Ltd.; solid content 20%) as a material having anion exchange ability, 60 parts of colloidal silica (Snowtex O, manufactured by Nissan Chemical Industries, Ltd.; solid content 20%) as a material having no anion exchange ability, and 25 parts of a liquid medium (water/isopropyl alcohol=1/1) were mixed followed by stirring it for 20 minutes by a dissolver to obtain printing ink which contains a material having anion exchange ability.

Thereafter, this printing ink having anion exchange ability was solid printed on an entire surface of the above coating film layer by a small gravure printer followed by drying to obtain a conductive coating film. The drying temperature of the printer was set at 60° C. as measured value.

Example 27

To 100 parts of the dispersion of silver fine particles described in above Synthetic example 3 as a conductive material, 5 parts of polyester resin (Elitel UE-3220, manufactured by UNITIKA Ltd.; 4.3% by weight in 100 parts of conductive ink) as the other resin and 10 parts of a liquid medium (methyl ethyl ketone) were mixed followed by stirring for 30 minutes by a dissolver to obtain conductive ink. Thereafter, this conductive ink was printed on a polyester film (Ester E5100, manufactured by TOYOBO Co., Ltd.; 100 μm thickness) by a small gravure printer to form a conductive circuit pattern of 3 mm in width followed by drying it to obtain a coating film layer containing a conductive material. The drying temperature of the printer was set at 90° C. as a measured value.

Next, 15 parts of a cationic resin (Pulset JK-510, manufactured by Meisei Chemical Works, Ltd.; solid content 20%) as a material having anion exchange ability, 60 parts of colloidal silica (Snowtex O, manufactured by Nissan Chemical Industries, Ltd.; solid content 20%) as a material having no anion exchange ability, and 25 parts of a liquid medium (water/isopropyl alcohol=1/1) were mixed followed by stirring it for 20 minutes by a dissolver to obtain printing ink which contains a material having anion exchange ability.

Thereafter, this ink having anion exchange ability was solid printed on an entire surface of the above coating film layer by a small gravure printer followed by drying it to obtain a conductive coating film. The drying temperature of the printer was set at 60° C. as measured value.

Example 28

To 100 parts of the dispersion of silver fine particles described in Synthetic example 3 as a conductive material, 0.5 parts of a leveling agent (BYK-051, manufactured by BYK-Chemie Japan; solid content 20%) as other additives were mixed (i.e., 0.1% by weight in 100 parts of conductive ink) followed by stirring for 10 minutes by a dissolver to obtain conductive ink. Thereafter, by use of this conductive ink, a conductive circuit pattern of 3 mm in width was printed on a polyester film (Ester E5100, manufactured by TOYOBO Co., Ltd.; 100 μm thickness) by a small gravure printer, followed by drying it to obtain a coating film layer containing a conductive material. The drying temperature of the printer was set at 90° C. as a measured value.

Next, 15 parts of a cationic resin (Pulset JK-510, manufactured by Meisei Chemical Works, Ltd.; solid content 20%) as a material having anion exchange ability, 60 parts of colloidal silica (Snowtex O, manufactured by Nissan Chemical Industries, Ltd.; solid content 20%) as a material having no anion exchange ability, and 25 parts of a liquid medium (water/isopropyl alcohol=1/1) were mixed followed by stirring it for 20 minutes by a dissolver to obtain printing ink which contains a material having anion exchange ability.

Thereafter, this ink having anion exchange ability was solid printed on an entire surface of the above coating film layer by a small gravure printer followed by drying it to obtain a conductive coating film. The drying temperature of the printer was set at 60° C. as measured value.

Example 29

The dispersion of silver fine particles described in above Synthetic example 3 for preparing conductive fine particles as a conductive material was printed on a polyester film (Ester E5100, manufactured by TOYOBO Co., Ltd.; 100 μm thickness) according to an ink-jet method to form a conductive circuit pattern of 3 mm in width, followed by drying it for 10 minutes in a hot air drying oven at 100° C. to obtain a coating film containing a conductive material.

Next, 15 parts of polyacetal resin (S-LEC KW-1, manufactured by SEKISUI CHEMICAL Co., Ltd.; solid content 20%) as the other resin, 60 parts of colloidal silica (Snowtex AK, manufactured by Nissan Chemical Industries, Ltd.; solid content 20%) as a material having anion exchange ability, and 25 parts of a liquid medium (water/diethylene glycol monoethyl ether acetate=4/6) were mixed followed by stirring it for 20 minutes by a dissolver to obtain a coating which contains a material having anion exchange ability. Thereafter, this coating having anion exchange ability was printed on the above coating film layer according to an ink-jet method followed by drying it for 5 minutes in a hot air oven drying at 100° C. to obtain a conductive coating film.

Example 30

A conductive coating film was obtained in the same manner as Example 29 except that the dispersion of Synthetic example 1 for preparing conductive fine particles was used as a dispersion of silver fine particles.

Example 31

A conductive coating film was obtained in the same manner as Example 29 except that the dispersion of Synthetic example 2 for preparing conductive fine particles was used as a dispersion of silver fine particles.

Example 32

A conductive coating film was obtained in the same manner as Example 29 except that the dispersion of Synthetic example 4 for preparing conductive fine particles was used as a dispersion of silver fine particles.

Example 33

The dispersion of silver fine particles described in above Synthetic example 3 for preparing conductive fine particles as a conductive material was printed on a polyester film (Ester E5100, manufactured by TOYOBO Co., Ltd.; 100 μm thickness) by a CI type flexographic printer (SOLOFLEX, manufactured by W&H, anilox 100 lines/inch) to form a conductive circuit pattern of 3 mm in width, followed by drying it to obtain a coating film layer containing a conductive material. The drying temperature was set at 100° C. as a measured value.

Next, 5 parts of a cationic resin (PAPIOGENE P-105, manufactured by SENKA Corporation; solid content 60%) as a material having anion exchange ability, 20 parts of colloidal silica (Snowtex O, manufactured by Nissan Chemical Industries, Ltd.; solid content 20%) as a material having no anion exchange ability, 40 parts of cationic colloidal silica (Snowtex AK, manufactured by Nissan Chemical Industries, Ltd.; solid content 20%) as a material having anion exchange ability, and 35 parts of a liquid medium (water/isopropyl alcohol=1/1) were mixed followed by stirring it for 20 minutes by a dissolver to obtain printing ink which contains a material having anion exchange ability. Thereafter, this ink having anion exchange ability was solid printed on an entire surface by a flexographic printer, thus obtaining a conductive coating film. The drying temperature of the printer was set at 70° C. as measured value.

Example 34

A conductive coating film was obtained in the same manner as Example 33 except that the drying temperature of the flexographic printer was set at 50° C. through the entire process.

Example 35

The dispersion of silver fine particles described in Synthetic example 3 for preparing conductive fine particles as a conductive material was solid printed on an entire surface of polyester cloth by a small gravure printer, followed by drying it to obtain a conductive coating film layer containing a conductive material. The drying temperature of the printer was set at 90° C. as a measured value.

Next, 15 parts of a cationic resin (Pulset JK-510, manufactured by Meisei Chemical Works, Ltd.; solid content 20%) as a material having anion exchange ability, 60 parts of colloidal silica (Snowtex O, manufactured by Nissan Chemical Industries, Ltd.; solid content 20%) as a material having no anion exchange ability, and 25 parts of a liquid medium (water/isopropyl alcohol=1/1) were mixed followed by stirring it for 20 minutes by a dissolver to obtain printing ink which contains a material having anion exchange ability.

Thereafter, this printing ink having anion exchange ability was solid printed on an entire surface of the above coating film layer by a small gravure printer followed by drying it to obtain a conductive coating film. The drying temperature of the printer was set at 60° C. as measured value.

Example 36

A conductive coating film was obtained in the same manner as Example 26 except that the dispersion of Synthetic example 5 for preparing conductive fine particles was used as a dispersion of silver fine particles.

Example 37

A conductive coating film was obtained in the same manner as Example 26 except that the dispersion of Synthetic example 6 for preparing conductive fine particles was used as a dispersion of silver fine particles.

Example 38

A conductive coating film was obtained in the same manner as Example 26 except that the dispersion of Synthetic example 7 for preparing conductive fine particles was used as a dispersion of silver fine particles.

Example 39

A conductive coating film was obtained in the same manner as Example 26 except that the dispersion of Synthetic example 8 for preparing conductive fine particles was used as a dispersion of silver fine particles.

Example 40

A conductive coating film was obtained in the same manner as Example 26 except that the dispersion of Synthetic example 9 for preparing conductive fine particles was used as a dispersion of silver fine particles.

Example 41

A conductive coating film was obtained in the same manner as Example 29 except that the dispersion of Synthetic example 10 for preparing conductive fine particles was used as a dispersion of silver fine particles.

Example 42

A conductive coating film was obtained in the same manner as Example 29 except that the dispersion of Synthetic example 11 for preparing conductive fine particles was used as a dispersion of silver fine particles.

Example 43

A conductive coating film was obtained in the same manner as Example 29 except that the dispersion of Synthetic example 12 for preparing conductive fine particles was used as a dispersion of silver fine particles.

Example 44

A conductive coating film was obtained in the same manner as Example 24 except that the dispersion of Synthetic example 12 for preparing conductive fine particles was used as a dispersion of silver fine particles.

Example 45

A conductive coating film was obtained in the same manner as Example 26 except that the dispersion of Synthetic example 12 for preparing conductive fine particles was used as a dispersion of silver fine particles.

Comparative Example 1

The dispersion of Psilver fine particles described in above Synthetic example 12 was printed on a polyester film (Ester E5100, manufactured by TOYOBO Co., Ltd.; 100 μm thickness) as a substrate according to a dispenser method to form a circuit pattern of 3 mm in width, followed by drying it for 10 minutes in a hot air oven at 120° C. to obtain a conductive coating film.

Comparative Example 2

15 parts of polyvinyl alcohol resin (Poval PVA-117, manufactured by Kuraray Co., Ltd.) as the other resin and 85 parts of a liquid medium (water/isopropyl alcohol=1/1) were mixed followed by stirring it for 60 minutes by a dissolver to obtain a coating. Next, this coating was applied on a polyester film (Ester E5100, manufactured by TOYOBO Co., Ltd.; 100 µm thickness) by a bar coater followed by drying it for 5 minutes at 75° C. to obtain a coating layer having thickness of 7 µm after drying.

Thereafter, the dispersion of silver fine particles described in above Synthetic example 12 for preparing conductive fine particles was printed on the above coating film according to a dispenser method to form a conductive circuit pattern of 3 mm in width, followed by drying it for 10 minutes in a hot air oven at 120° C. to obtain a conductive coating film.

Comparative Example 3

15 parts of polyacetal resin (S-LEC KW-1, manufactured by SEKISUI CHEMICAL Co., Ltd.; solid content 20%) as the other resin, 60 parts of colloidal silica (Snowtex O, manufactured by Nissan Chemical Industries, Ltd.; solid content 20%) as a material having no anion exchange ability, and 25 parts of a liquid medium (water/diethylene glycol monoethyl ether acetate=4/6) were mixed followed by stirring it for 20 minutes by a dissolver to obtain ink for an ink-jet printer. Next, this ink was printed on a polyester film (Ester E5100, manufactured by TOYOBO Co., Ltd.; 100 µm thickness) according to an ink-jet printing method followed by drying it for 10 minutes in a hot air oven at 100° C. to obtain a coating film having a film thickness of 5 µm.

Thereafter, the dispersion of silver fine particles described in above Synthetic example 2 for preparing conductive fine particles was printed on the above coating film according to an ink-jet method to form a conductive circuit pattern of 3 mm in width, followed by drying for 10 minutes in a hot air oven at 150° C. to obtain a conductive coating film.

Comparative Example 4

15 parts of polyacetal resin (S-LEC KW-1, manufactured by SEKISUI CHEMICAL Co., Ltd.; solid content 20%) as the other resin, 60 parts of colloidal silica (Snowtex O, manufactured by Nissan Chemical Industries, Ltd.; solid content 20%) as a material having no anion exchange ability, and 25 parts of a liquid medium (water/isopropyl alcohol=1/1) were mixed followed by stirring it for 20 minutes by a dissolver to obtain printing ink. Next, this ink was solid printed on the entire surface of a polyester film (Ester E5100, manufactured by TOYOBO Co., Ltd.; 100 µm thickness) by a CI type flexographic printer (SOLOFLEX, manufactured by W&H, anilox 100 lines/inch) followed by drying it to obtain a coating film layer having a thickness of 5 µm after drying. The drying temperature of the printer was set at 70° C. as measured value.

Thereafter, the dispersion of silver fine particles described in above Synthetic example 3 for preparing conductive fine particles was printed on the above coating film by a flexographic printer to form a conductive circuit pattern of 3 mm in width, thus obtaining a conductive coating film. The drying temperature of the printer was set at 50° C. as measured value.

Comparative Example 5

15 parts of polyacetal resin (S-LEC KW-1, manufactured by SEKISUI CHEMICAL Co., Ltd.; solid content 20%) as the other resin, 60 parts of colloidal silica (Snowtex O, manufactured by Nissan Chemical Industries, Ltd.; solid content 20%) as a material having no anion exchange ability, and 25 parts of a liquid medium (water/isopropyl alcohol=1/1) were mixed followed by stirring it for 20 minutes by a dissolver to obtain printing ink. Next, this ink was solid printed on the entire surface of a polyester film (Ester E5100, manufactured by TOYOBO Co., Ltd.; 100 µm thickness) by a small gravure printer followed by drying it to obtain a coating film layer having thickness of 5 µm after drying. The drying temperature of the printer was set at 60° C. as measured value.

Thereafter, the dispersion of silver fine particles described in above Synthetic example 8 for preparing conductive fine particles was gravure printed on the above coating film by a small gravure printer to form a conductive circuit pattern of 3 mm in width, followed by drying it to obtain a conductive coating film. The drying temperature of the printer was set at 100° C. as measured value.

Comparative Example 6

A conductive coating film was obtained in the same manner as Comparative example 5 except that the dispersion of Synthetic example 9 for preparing conductive fine particles was used as a dispersion of silver fine particles.

Comparative Example 7

The dispersion of silver fine particles described in above Synthetic example 12 for preparing conductive fine particles as a conductive material was printed on a polyester film (Ester E5100, manufactured by TOYOBO Co., Ltd.; 100 µm thickness) according to a dispenser method to form a conductive circuit pattern of 3 mm in width, followed by drying it for 10 minutes in a hot air oven at 100° C. to obtain a coating film layer containing a conductive material.

Next, 15 parts of polyvinyl alcohol resin (Poval PVA-117, manufactured by Kuraray Co., Ltd.) as the other resin and 85 parts of a liquid medium (water/isopropyl alcohol=1/1) were mixed followed by stirring it for 60 minutes by a dissolver to obtain a coating. Thereafter, this coating was applied on the above coating film by a bar coater, followed by drying it for 5 minutes at 70° C. to obtain a conductive coating film.

Comparative Example 8

The dispersion of silver fine particles described in above Synthetic example 2 for preparing conductive fine particles as a conductive material was printed on a polyester film (Ester E5100, manufactured by TOYOBO Co., Ltd.; 100 µm thickness) according to an ink-jet method to form a conductive circuit pattern of 3 mm in width, followed by drying it for 10 minutes in a hot air oven at 100° C. to obtain a coating film layer containing a conductive material.

Next, 15 parts of polyacetal resin (S-LEC KW-1, manufactured by SEKISUI CHEMICAL Co., Ltd.; solid content 20%) as the other resin, 60 parts of colloidal silica (Snowtex O, manufactured by Nissan Chemical Industries, Ltd.; solid content 20%) as a material having no anion exchange ability, and 25 parts of a liquid medium (water/diethylene glycol monoethyl ether acetate=4/6) were mixed followed by stirring it for 20 minutes by a dissolver to obtain ink for an ink-jet printer. Thereafter, this ink was printed on the above coating film according to an ink-jet method followed by drying it for 5 minutes in a hot air oven at 100° C. to obtain a conductive coating film.

Comparative Example 9

The dispersion of silver fine particles described in above Synthetic example 3 for preparing conductive fine particles as a conductive material was printed on a polyester film (Ester E5100, manufactured by TOYOBO Co., Ltd.; 100 μm thickness) by a CI type flexographic printer (SOLOFLEX, manufactured by W&H, anilox 100 lines/inch) to form a conductive circuit pattern of 3 mm in width, thus obtaining a coating film layer containing a conductive material. The drying temperature of the printer was set at 50° C. as measured value.

Next, 15 parts of polyacetal resin (S-LEC KW-1, manufactured by SEKISUI CHEMICAL Co., Ltd.; solid content 20%) as the other resin, 60 parts of colloidal silica (Snowtex O, manufactured by Nissan Chemical Industries, Ltd.; solid content 20%) as a material having no anion exchange ability, and 25 parts of a liquid medium (water/isopropyl alcohol=1/1) were mixed followed by stirring it for 20 minutes by a dissolver to obtain printing ink.

Thereafter, this ink was solid printed on the entire surface of the above coating film by a flexographic printer followed by drying it to obtain a conductive coating film. The drying temperature was set at 50° C. as measured value.

Comparative Example 10

The dispersion of silver fine particles described in above Synthetic example 8 for preparing conductive fine particles as a conductive material was printed on a polyester film (Ester E5100, manufactured by TOYOBO Co., Ltd.; 100 μm thickness) by a small gravure printer to form a conductive circuit pattern of 3 mm in width, followed by drying it to obtain a coating film containing a conductive material. The drying temperature of the printer was set at 90° C. as measured value.

Next, 15 parts of polyacetal resin (S-LEC KW-1, manufactured by SEKISUI CHEMICAL Co., Ltd.; solid content 20%) as the other resin, 60 parts of colloidal silica (Snowtex O, manufactured by Nissan Chemical Industries, Ltd.; solid content 20%) as a material having no anion exchange ability, and 25 parts of a liquid medium (water/isopropyl alcohol=1/1) were mixed followed by stirring it for 20 minutes by a dissolver to obtain a coating.

Thereafter, this coating was solid printed on the entire surface of the above coating film layer by a small gravure printer followed by drying it to obtain a conductive coating film. The drying temperature of the printer was set at 60° C. as measured value.

Comparative Example 11

A conductive coating film was obtained in the same manner as Comparative example 10 except that the dispersion of Synthetic example 9 for preparing conductive fine particles was used as a dispersion of silver fine particles.

Comparative Example 12

The dispersion of silver fine particles described in above Synthetic example 3 for preparing conductive fine particles as a conductive material was solid printed on the entire surface a polyester cloth by a small gravure printer, followed by drying it to obtain a conductive coating film. The drying temperature of the printer was set at 90° C. as measured value.

The conductive circuits or conductive coating films that had been obtained in the above Examples and Comparative examples were evaluated according to the following methods, in terms of adhesiveness, volume resistance, surface resistance, and bending resistance. Results are summarized in Table 1 to Table 5.

[Adhesiveness to Substrate]

On a conductive circuit or a conductive coating film that are formed on a polyester film (Ester E5100, manufactured by TOYOBO Co., Ltd.; 100 μm thickness), a glass plate or a polyester cloth, an adhesive cellophane tape (Nichiban Corp., 12 mm width) was put. Degree of the peeling of the coating film, which is observed when the adhesive cellophane tape is peeled off rapidly, was evaluated based on the following evaluation criteria.

(Evaluation Criteria)

○: Almost no peeling (less than 10% of the area was peeled)

Δ: Partial peeling (10% or more and less than 50% of the area was peeled)

x: Almost complete peeling (50% or more of the area was peeled)

[Volume Resistance]

The resistance of the conductive circuit pattern having 3 mm width as obtained above was measured using a 4-probe resistance meter ("DR-1000 CU" type, manufactured by Sanwa Denki Keiki Co., Ltd.) at four positions with 30 mm interval. Thickness of the conductive circuit was measured using a film thickness tester ("MH-15M" type, manufactured by Sendai Nikon Corporation). From thus obtained values of resistance and film thickness, volume resistance was calculated. Further, when measuring the resistance of the conductive coating film, after processing it to have 3 mm width, volume resistance ($\Omega \cdot cm$) was measured in the same manner as described above.

Further, when lamination is carried out in an order of a coating film layer containing a conductive material and an anion exchange layer, part of the anion exchange layer was stripped off to expose the conductive coating film layer, and then resistance and film thickness were measured to obtain volume resistance.

[Surface Resistance]

When a coating film containing a conductive material was formed on the entire surface of a polyester cloth as a substrate by solid printing, the conductive coating film was processed to have a size of 3 mm×10 cm, and then resistance ($\Omega$) between two spots (10 cm in width) was measured by using a 4-probe resistance meter. Further, when lamination is carried out in an order of a coating film layer containing a conductive material and an anion exchange layer, part of the anion exchange layer was stripped off to expose the conductive coating film layer, and then resistance was measured.

[Bending Resistance]

Volume resistance or surface resistance of a coating film layer formed by a film forming composition containing a conductive material, for example conductive ink or a conductive coating, was measured. The subject was then bent 180° while having the coated side get faced inward. Thereafter the subject was again bent 180° while having the coated side get faced outward. Consequently, volume resistance or surface resistance was measured again, and Degree of a change in resistance before and after the bending was evaluated based on the following evaluation criteria.

(Evaluation Criteria)

○: Less than 20% of change in volume resistance

Δ: 20% ore more and less than 30% of change in volume resistance x: 30% or more of change in volume resistance

TABLE 1

Constitution of conductive coating film (parts) and evaluation results

| | | Ex. 1 | Ex. 2 | Ex. 3 | Ex. 4 | Ex. 5 | Ex. 6 |
|---|---|---|---|---|---|---|---|
| Material | | | | | | | |
| Composition for forming conductive coating film | Conductive fine particle | Synth. Ex. 1 | Synth. Ex. 2 | Synth. Ex. 3 | Synth. Ex. 3 | Synth. Ex. 3 | Synth. Ex. 3 |
| | (Protective material) | Oleic acid | Propionic acid | Pentanoic acid | Pentanoic acid | Pentanoic acid | Pentanoic acid |
| | Other resin | — | — | — | Polyester resin | Leveling agent | — |
| Material having anion exchange ability | Cationic resin | 60 | — | 15 | 15 | 15 | — |
| | Cationic colloidal silica | — | — | — | — | — | 60 |
| | QAS** | — | 2.5 | — | — | — | — |
| MAEA* | Colloidal silica | — | — | 60 | 60 | 60 | — |
| Other resin | Polyvinyl alcohol | — | 7.5 | — | — | — | — |
| | Polyacetal | — | — | — | — | — | 15 |
| Liquid medium | | 40 | 90 | 25 | 25 | 25 | 25 |
| Evaluation result | | | | | | | |
| Adhesiveness to substrate | UMCT*** | ○ | ○ | ○ | ○ | ○ | ○ |
| Volume resistance | ($\Omega \cdot cm$) | $5.9 \times 10^{-6}$ | $2.2 \times 10^{-6}$ | $3.8 \times 10^{-6}$ | $4.8 \times 10^{-6}$ | $4.2 \times 10^{-6}$ | $2.7 \times 10^{-6}$ |
| Bending resistance | Change of resistance | ○ | ○ | ○ | ○ | ○ | ○ |
| | | Ex. 7 | Ex. 8 | Ex. 9 | Ex. 10 | Ex. 11 | Ex. 12 |
| Material | | | | | | | |
| Composition for forming conductive coating film | Conductive fine particle | Synth. Ex. 1 | Synth. Ex. 2 | Synth. Ex. 4 | Synth. Ex. 3 | Synth. Ex. 3 | Synth. Ex. 3 |
| | (Protective material) | Oleic acid | Propionic acid | Hexanoic acid | Pentanoic acid | Pentanoic acid | Pentanoic acid |
| | Other resin | — | — | — | — | — | — |
| Material having anion exchange ability | Cationic resin | — | — | — | 5 | 5 | 15 |
| | Cationic colloidal silica | 60 | 60 | 60 | 40 | 40 | — |
| | QAS** | — | — | — | — | — | — |
| MAEA* | Colloidal silica | — | — | — | 20 | 20 | 60 |
| Other resin | Polyvinyl alcohol | — | — | — | — | — | — |
| | Polyacetal | 15 | 15 | 15 | — | — | — |
| Liquid medium | | 25 | 25 | 25 | 35 | 35 | 25 |
| Evaluation result | | | | | | | |
| Adhesiveness to substrate | UMCT*** | ○ | ○ | ○ | ○ | ○ | Δ-○ |
| Volume resistance | ($\Omega \cdot cm$) | $3.8 \times 10^{-6}$ | $2.3 \times 10^{-6}$ | $2.9 \times 10^{-6}$ | $6.6 \times 10^{-6}$ | $1.2 \times 10^{-5}$ | 0.45**** |
| Bending resistance | Change of resistance | ○ | ○ | ○ | ○ | ○ | ○ |

MAEA*: Material having or not having anion exchange ability
QAS**: Quaternary ammonium salt
UMCT***: Using method of cellophane tape
****Surface resistance ($\Omega$)

TABLE 2

Constitution of conductive coating film (parts) and evaluation results

| | | Ex. 13 | Ex. 14 | Ex. 15 | Ex. 16 | Ex. 17 | Ex. 18 |
|---|---|---|---|---|---|---|---|
| Material | | | | | | | |
| Composition for forming conductive coating film | Conductive fine particle | Synth. Ex. 5 | Synth. Ex. 6 | Synth. Ex. 7 | Synth. Ex. 8 | Synth. Ex. 9 | Synth. Ex. 10 |
| | (Protective material) | Octanoic acid | Milistic acid | Stearic acid | Butanoic acid | PB821/ Propionic acid | PW36/ Pentanoic acid |
| | Conductive powder | — | — | — | — | — | — |
| Material having anion exchange ability | Cationic resin | 15 | 15 | 15 | 15 | 15 | — |
| | Cationic colloidal silica | — | — | — | — | — | 60 |
| | QAS** | — | — | — | — | — | — |
| MAEA* | Colloidal silica | 60 | 60 | 60 | 60 | 60 | — |
| Other resin | Polyvinyl alcohol | — | — | — | — | — | — |
| | Polyacetal | — | — | — | — | — | 15 |
| Liquid medium | | 25 | 25 | 25 | 25 | 25 | 25 |
| Evaluation result | | | | | | | |
| Adhesiveness to substrate | UMCT*** | ○ | ○ | ○ | ○ | ○ | ○ |
| Volume resistance | ($\Omega \cdot$ cm) | $4.5 \times 10^{-6}$ | $5.1 \times 10^{-6}$ | $6.3 \times 10^{-6}$ | $2.9 \times 10^{-6}$ | $8.7 \times 10^{-6}$ | $1.8 \times 10^{-5}$ |
| Bending resistance | Change of resistance | ○ | ○ | ○ | ○ | ○ | ○ |

| | | Ex. 19 | Ex. 20 | Ex. 21 | Ex. 22 | Ex. 23 |
|---|---|---|---|---|---|---|
| Material | | | | | | |
| Composition for forming conductive coating film | Conductive fine particle | Synth. Ex. 11 | Synth. Ex. 12 | Synth. Ex. 12 | Synth. Ex. 12 | — |
| | (Protective material) | EFKA5010/ Hexanoic acid | Solsperse 32000 | Solsperse 32000 | Solsperse 32000 | — |
| | Conductive powder | — | — | — | — | 49.5 |
| Material having anion exchange ability | Cationic resin | — | 15 | — | 60 | 36 |
| | Cationic colloidal silica | 60 | — | 60 | — | — |
| | QAS** | — | — | — | — | — |
| MAEA* | Colloidal silica | — | 60 | — | — | — |
| Other resin | Polyvinyl alcohol | — | — | — | — | — |
| | Polyacetal | 15 | — | 15 | — | 5 |
| Liquid medium | | 25 | 25 | 25 | 40 | 9.5 |
| Evaluation result | | | | | | |
| Adhesiveness to substrate | UMCT*** | ○ | ○ | ○ | ○ | ○ |
| Volume resistance | ($\Omega \cdot$ cm) | $2.5 \times 10^{-5}$ | $2.0 \times 10^{-3}$ | $1.4 \times 10^{-3}$ | $9.2 \times 10^{-4}$ | $9.6 \times 10^{-6}$ |
| Bending resistance | Change of resistance | ○ | ○ | Δ | ○ | Δ |

MAEA*: Material having or not having anion exchange ability
QAS**: Quaternary ammonium salt
UMCT***: Using method of cellophane tape
****Surface resistance ($\Omega$)

TABLE 3

Constitution of conductive coating film (parts) and evaluation results

| | | Ex. 24 | Ex. 25 | Ex. 26 | Ex. 27 | Ex. 28 | Ex. 29 |
|---|---|---|---|---|---|---|---|
| Material | | | | | | | |
| Composition for forming conductive coating film | Conductive fine particle | Synth. Ex. 1 | Synth. Ex. 2 | Synth. Ex. 3 | Synth. Ex. 3 | Synth. Ex. 3 | Synth. Ex. 3 |
| | (Protective material) | Oleic acid | Propionic acid | Pentanoic acid | Pentanoic acid | Pentanoic acid | Pentanoic acid |
| | Other resin | — | — | — | Polyester resin | Leveling agent | — |
| Material having anion exchange ability | Cationic resin | 60 | — | 15 | 15 | 15 | — |
| | Cationic colloidal silica | — | — | — | — | — | 60 |
| | QAS** | — | 2.5 | — | — | — | — |
| MAEA* | Colloidal silica | — | — | 60 | 60 | 60 | — |
| Other resin | Polyvinyl alcohol | — | 7.5 | — | — | — | — |
| | Polyacetal | — | — | — | — | — | 15 |
| Liquid medium | | 40 | 90 | 25 | 25 | 25 | 25 |
| Evaluation result | | | | | | | |
| Adhesiveness to substrate | UMCT*** | ○ | ○ | ○ | ○ | ○ | ○ |
| Volume resistance | ($\Omega \cdot$ cm) | $6.1 \times 10^{-6}$ | $2.5 \times 10^{-6}$ | $4.0 \times 10^{-6}$ | $5.1 \times 10^{-6}$ | $4.4 \times 10^{-6}$ | $3.0 \times 10^{-6}$ |
| Bending resistance | Change of resistance | ○ | ○ | ○ | ○ | ○ | ○ |
| | | Ex. 30 | Ex. 31 | Ex. 32 | Ex. 33 | Ex. 34 | Ex. 35 |
| Material | | | | | | | |
| Composition for forming conductive coating film | Conductive fine particle | Synth. Ex. 1 | Synth. Ex. 2 | Synth. Ex. 4 | Synth. Ex. 3 | Synth. Ex. 3 | Synth. Ex. 3 |
| | (Protective material) | Oleic acid | Propionic acid | Hexanoic acid | Pentanoic acid | Pentanoic acid | Pentanoic acid |
| | Other resin | — | — | — | — | — | — |
| Material having anion exchange ability | Cationic resin | — | — | — | 5 | 5 | 15 |
| | Cationic colloidal silica | 60 | 60 | 60 | 40 | 40 | — |
| | QAS** | — | — | — | — | — | — |
| MAEA* | Colloidal silica | — | — | — | 20 | 20 | 60 |
| Other resin | Polyvinyl alcohol | — | — | — | — | — | — |
| | Polyacetal | 15 | 15 | 15 | — | — | — |
| Liquid medium | | 25 | 25 | 25 | 35 | 35 | 25 |
| Evaluation result | | | | | | | |
| Adhesiveness to substrate | UMCT*** | ○ | ○ | ○ | ○ | ○ | Δ |
| Volume resistance | ($\Omega \cdot$ cm) | $4.9 \times 10^{-6}$ | $2.5 \times 10^{-6}$ | $3.5 \times 10^{-6}$ | $6.8 \times 10^{-6}$ | $1.8 \times 10^{-5}$ | 0.58**** |
| Bending resistance | Change of resistance | ○ | ○ | ○ | ○ | ○ | ○ |

MAEA*: Material having or not having anion exchange ability
QAS**: Quaternary ammonium salt
UMCT***: Using method of cellophane tape
****Surface resistance ($\Omega$)

TABLE 4

Constitution of conductive coating film (parts) and evaluation results

| | | Ex. 36 | Ex. 37 | Ex. 38 | Ex. 39 | Ex. 40 | Ex. 41 |
|---|---|---|---|---|---|---|---|
| Material | | | | | | | |
| Composition for forming conductive coating film | Conductive fine particle (Protective material) | Synth. Ex. 5 Octanoic acid | Synth. Ex. 6 Milistic acid | Synth. Ex. 7 Stearic acid | Synth. Ex. 8 Butanoic acid | Synth. Ex. 9 PB821/ Propionic acid | Synth. Ex. 10 PW36/ Pentanoic acid |
| Material having anion exchange ability | Cationic resin | 15 | 15 | 15 | 15 | 15 | — |
| | Cationic colloidal silica | — | — | — | — | — | 60 |
| | QAS** | — | — | — | — | — | — |
| MAEA* | Colloidal silica | 60 | 60 | 60 | 60 | 60 | — |
| Other resin | Polyvinyl alcohol | — | — | — | — | — | — |
| | Polyacetal | — | — | — | — | — | 15 |
| Liquid medium | | 25 | 25 | 25 | 25 | 25 | 25 |
| Evaluation result | | | | | | | |
| Adhesiveness to substrate | UMCT*** | ○ | ○ | ○ | ○ | ○ | ○ |
| Volume resistance | ($\Omega \cdot$ cm) | $4.8 \times 10^{-6}$ | $5.6 \times 10^{-6}$ | $6.8 \times 10^{-6}$ | $3.3 \times 10^{-6}$ | $9.0 \times 10^{-6}$ | $2.3 \times 10^{-5}$ |
| Bending resistance | Change of resistance | ○ | ○ | ○ | ○ | ○ | ○ |

| | | Ex. 42 | Ex. 43 | Ex. 44 | Ex. 45 |
|---|---|---|---|---|---|
| Material | | | | | |
| Composition for forming conductive coating film | Conductive fine particle (Protective material) | Synth. Ex. 11 EFKA5010/ Hexanoic acid | Synth. Ex. 12 Solsperse 32000 | Synth. Ex. 12 Solsperse 32000 | Synth. Ex. 12 Solsperse 32000 |
| Material having anion exchange ability | Cationic resin | — | — | 60 | 15 |
| | Cationic colloidal silica | 60 | 60 | — | — |
| | QAS** | — | — | — | — |
| MAEA* | Colloidal silica | — | — | — | 60 |
| Other resin | Polyvinyl alcohol | — | — | — | — |
| | Polyacetal | 15 | 15 | — | — |
| Liquid medium | | 25 | 25 | 40 | 25 |
| Evaluation result | | | | | |
| Adhesiveness to substrate | UMCT*** | ○ | ○ | ○ | ○ |
| Volume resistance | ($\Omega \cdot$ cm) | $3.6 \times 10^{-5}$ | $3.4 \times 10^{-3}$ | $7.5 \times 10^{-4}$ | $1.1 \times 10^{-3}$ |
| Bending resistance | Change of resistance | ○ | ○ | Δ | ○ |

MAEA*: Material having or not having anion exchange ability
QAS**: Quaternary ammonium salt
UMCT***: Using method of cellophane tape
****Surface resistance ($\Omega$)

TABLE 5

Constitution of conductive coating film (parts) and evaluation results

| | | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|
| Material | | | | | | | |
| Composition for forming conductive coating film | Conductive fine particle (Protective material) | Synth. Ex. 12 Solsperse 32000 | Synth. Ex. 12 Solsperse 32000 | Synth. Ex. 2 Propionic acid | Synth. Ex. 3 Pentanoic acid | Synth. Ex. 8 Butanoic acid | Synth. Ex. 9 PB821/ Propionic acid |
| Material having anion exchange ability | Cationic resin | — | — | — | — | — | — |
| | Cationic colloidal silica | — | — | — | — | — | — |
| | QAS** | — | — | — | — | — | — |
| MAEA* | Colloidal silica | — | — | 60 | 60 | 60 | 60 |
| Other resin | Polyvinyl alcohol | — | 15 | — | — | — | — |
| | Polyacetal | — | — | 15 | 15 | 15 | 15 |
| Liquid medium | | — | 85 | 25 | 25 | 25 | 25 |
| Evaluation result | | | | | | | |
| Adhesiveness to substrate | UMCT*** | X | Δ | ○ | ○ | ○ | ○ |
| Volume or surface resistance | (Ω · cm, Ω) | N.M. | N.M. | 5.2 | 2040 | 50 | 175 |
| Bending resistance | Change of resistance | — | — | ○ | ○ | ○ | ○ |

| | | Comp. Ex. 7 | Comp. Ex. 8 | Comp. Ex. 9 | Comp. Ex. 10 | Comp. Ex. 11 | Comp. Ex. 12 |
|---|---|---|---|---|---|---|---|
| Material | | | | | | | |
| Composition for forming conductive coating film | Conductive fine particle (Protective material) | Synth. Ex. 12 Solsperse 32000 | Synth. Ex. 2 Propionic acid | Synth. Ex. 3 Pentanoic acid | Synth. Ex. 8 Butanoic acid | Synth. Ex. 9 PB821/ Propionic acid | Synth. Ex. 3 Pentanoic acid |
| Material having anion exchange ability | Cationic resin | — | — | — | — | — | — |
| | Cationic colloidal silica | — | — | — | — | — | — |
| | QAS** | — | — | — | — | — | — |
| MAEA* | Colloidal silica | — | 60 | 60 | 60 | 60 | — |
| Other resin | Polyvinyl alcohol | 15 | — | — | — | — | — |
| | Polyacetal | — | 15 | 15 | 15 | 15 | — |
| Liquid medium | | 85 | 25 | 25 | 25 | 25 | — |
| Evaluation result | | | | | | | |
| Adhesiveness to substrate | UMCT*** | Δ | ○ | ○ | ○ | ○ | Δ |
| Volume or surface resistance | (Ω · cm, Ω) | N.M. | 10.3 | 3100 | 88 | 262 | N.M. |
| Bending resistance | Change of resistance | — | ○ | ○ | ○ | ○ | — |

MAEA*: Material having or not having anion exchange ability
QAS**: Quaternary ammonium salt
UMCT***: Using method of cellophane tape
****Surface resistance (Ω)
N.M.: Not measurable According to the results obtained from Example 1 to 45, it is found that by bringing a conductive material covered with a protective material into contact with a material having anion exchange ability, which is the characteristic of the present invention, conductivity that cannot be obtained from prior art can be obtained in the present invention. In particular, when Example 8, Example 11, and Example 16 are compared to Comparative example 3, Comparative example 4, and Comparative example 5, and also when Example 31, Example 34, and Example 39 are compared to Comparative example 8, Comparative example 9, and Comparative example 10, excellent conductivity was obtained regardless of a printing method or a drying condition at low temperature. It is believed that, when a low molecular weight fatty acid such as propionic acid, pentanoic acid, butanoic acid or hexanoic acid and the like is used as a protective material, an anion exchange reaction by a material having anion exchange ability can occur rapidly so that fusion and metallization of conductive fine particles is promoted, resulting in excellent conductivity.

Further, the conductive coating film that is obtained from the above Examples has excellent adhesiveness to a substrate and is stable as having little change in resistance after bending, regardless of the constitution of the layer and a method for producing a conductive coating film.

When Example 17 to 22 and Example 40 to 45, in which conductive materials including a combination of a fatty acid and a pigment dispersing agent, and only a pigment dispersing agent are used as a protective material, are compared to Comparative example 2, Comparative example 6 and Comparative example 11, the conductivity is improved. It shows evidently the effect by the contact between a conductive material and a material having anion exchange ability.

As it can be seen from the results of Comparative examples, when conductive fine particles are used alone or not in combination with a material having anion exchange ability, sufficient performance cannot be obtained from the resulting conductive coating film.

Industrial Applicability

The conductive coating film of the present invention can be used as a conductive film or a conductive circuit for any use in the field wherein a conventional conductive film has been used, for example, an antenna circuit for a non-contact type IC media, a conductive circuit on a print board, a conductive material for printing electronics, various types of electrode materials, a mesh forming material for shield an electromagnetic wave, a conductive thin film for shielding an electromagnetic wave, an anti-static film, and a film for providing conductivity to a non-conductive material. In particular, it is preferably used as a conductive film for an antenna circuit for a non-contact type IC media and the like.

What is claimed is:

1. A method for producing a conductive coating film, wherein a conductive material covered with a protective material is brought into contact with a material having anion exchange ability selected from the group consisting of an anion exchange resin, a cationic compound, and inorganic ion exchanger, wherein the conductive material covered with a protective material is brought into contact with a material having anion exchange ability by forming an anion exchange layer containing a material having anion exchange ability on a substrate and then forming a coating film layer containing a conductive material covered with a protective material on the anion exchange layer, or forming a coating film layer containing a conductive material covered with a protective material on a substrate and then forming an anion exchange layer containing a material having anion exchange ability on the coating film layer, wherein the protective material is stripped from the surface of the conductive material or is exchanged with ions by contacting the conductive material covered with protective material with the material having anion exchange ability resulting in the conductive material losing dispersion stability and being agglomerated and fused to form the conductive coating film.

2. The method for producing a conductive coating film according to claim 1, wherein the protective material contains a dispersing agent.

3. The method for producing a conductive coating film according to claim 2, wherein the dispersing agent contains a fatty acid.

4. The method for producing a conductive coating film according to claim 3, wherein the fatty acid includes a saturated or unsaturated fatty acid having carbon atoms of 3 to 22.

5. The method for producing a conductive coating film according to claim 1, wherein the conductive material is conductive fine particles having an average particle diameter of 0.001 to 10 µm.

6. The method for producing a conductive coating film according to claim 5, wherein the conductive material is at least one material selected from metals consisting of gold, silver, copper, nickel, platinum, palladium and iron, and alloys of these metals.

7. The method for producing a conductive coating film according to claim 5, wherein the conductive material is silver.

* * * * *